United States Patent [19]
Ohno

[11] Patent Number: 5,621,232
[45] Date of Patent: Apr. 15, 1997

[54] SEMICONDUCTOR DEVICE INCLUDING A LOCAL INTERCONNECTION BETWEEN AN INTERCONNECTION LAYER AND AN ADJOINING IMPURITY REGION

[75] Inventor: Takio Ohno, Hyogo, Japan

[73] Assignee: Mitsubishi Denki Kabushiki Kaisha, Tokyo, Japan

[21] Appl. No.: 522,223

[22] Filed: Sep. 1, 1995

Related U.S. Application Data

[63] Continuation of Ser. No. 225,168, Apr. 8, 1994, abandoned.

[30]    Foreign Application Priority Data

Oct. 5, 1993 [JP] Japan ................................ 5-249518

[51] Int. Cl.$^6$ .......................... H01L 29/76; H01L 29/94; H01L 31/062; H01L 27/11
[52] U.S. Cl. .................. 257/288; 257/384; 257/388; 257/413; 257/755; 257/903
[58] Field of Search ................................. 257/382, 383, 257/384, 388, 393, 412, 413, 755, 757, 761, 763, 764, 766, 768, 769, 770, 408, 344, 288, 903

[56]            References Cited

U.S. PATENT DOCUMENTS

| | | | |
|---|---|---|---|
| 4,305,200 | 12/1981 | Fu et al. | 257/412 |
| 4,925,807 | 5/1990 | Yoshikawa | 257/408 |
| 5,061,975 | 10/1991 | Inuishi et al. | 257/344 |

FOREIGN PATENT DOCUMENTS

| | | | |
|---|---|---|---|
| 58-166770 | 10/1983 | Japan | 257/412 |
| 2-12835 | 1/1990 | Japan | 257/408 |

OTHER PUBLICATIONS

"Titanium Nitride Local Interconnect Technology for VLSI", Thomas Tang et al., IEEE Transactions on Electron Devices, vol. ED–34, No. 3, Mar. 1987, pp. 682–688.

"Manufactuable Local Interconnect Technology Fully Compatible with Titanium Salicide Process", H. Hayashida et al., IEEE, Jun. 1991 VMIC Conference, pp. 332–334.

"A Manufacturable Process for the Formation of Self Aligned Cobalt Silicide in a Sub Micrometer CMOS Technology", Antonio Berti et al., Jun. 1992 VMIC Conference, pp. 267–273.

*Primary Examiner*—Steven H. Loke
*Attorney, Agent, or Firm*—Lowe, Price, LeBlanc & Becker

[57]            ABSTRACT

A p-type silicon substrate is provided at its main surface with n-type impurity regions with a space between each other. A gate electrode is formed on a region between the n-type impurity regions with a gate insulating film therebetween. A titanium silicide layer is formed in a region extending from a surface layer of the gate electrode to a surface layer of the n-type impurity region. The titanium silicide layer forms a local interconnection. A side wall insulating film remains on a side wall of the gate electrode on which the titanium silicide layer is not formed. Thereby, the semiconductor device can have a local interconnection which has high reliability and can be formed easily.

8 Claims, 23 Drawing Sheets

SEMICONDUCTOR DEVICE INCLUDING A LOCAL INTERCONNECTION BETWEEN AN INTERCONNECTION LAYER AND AN ADJOINING IMPURITY REGION

This application is a continuation of application Ser. No. 08/225,168, filed Apr. 8, 1994, now abandoned.

BACKGROUND OF THE INVENTION

1. Field of the Invention

The present invention relates to a semiconductor device having a local interconnection connecting an interconnection layer to an impurity region adjoining to the same.

2. Description of the Related Art

It has been known that electrically conductive layers can be connected together by a local interconnection without forming an interlayer insulating film and a contact hole. The local interconnection, which does not require the interlayer insulating film and contact hole, can easily achieve high integration of a device. Semiconductor devices having local interconnections are disclosed, for example, in IEEE *Transactions on Electron Devices*, Vol. ED-34, No. 3, March 1987, PP.682–688 (Reference (1)), and IEEE Jun. 11–12, 1991 *VMIC Conference*, pp.332–334 (Reference (2)).

The reference (1) discloses a technique in which an impurity region and a gate electrode are connected together using TiN. The reference (2) discloses a technique in which, after forming a gate electrode, a polysilicon layer for forming a local interconnection is formed, and then a surface of the polysilicon layer is turned into silicide to form the local interconnection connecting impurity regions together.

Between the two references (1) and (2) above, contents of the reference (1), in which the local interconnection made of TiN connects the gate electrode and impurity region together, are closer to the present invention, in view of contents of the invention which will be described later. Therefore, the prior art will be described below based on the contents of the reference (1).

FIG. 45 is an equivalent circuit diagram showing a boosting circuit which is an example of the device utilizing the technique disclosed in reference (1). FIG. 46 is a cross section showing a region 100 of FIG. 45.

Referring first to FIG. 45, description will be made in connection with the boosting circuit. In FIG. 45, an MOS transistor 108a and an MOS diode 108b are connected in series between a power terminal receiving a supply voltage Vcc and an output terminal 121. The MOS transistor 108a receives at its gate electrode a control signal $\phi_2$. A node N between the MOS transistor 108a and MOS diode 108b receives a control signal $\phi_5$ through a capacitor 120.

An operation of the boosting circuit thus structured will be described below. When the control signal $\phi_2$ rises from 0 V to Vcc+$\alpha$, the MOS transistor 108a is turned on, where $\alpha$ is a voltage not less than a threshold voltage Vth of the MOS transistor 108a. Thereby, the node N is charged to the supply voltage Vcc. Thereafter, the control signal $\phi_2$ goes to 0 V, and the MOS transistor 108a is turned off.

Then, the control signal $\phi_5$ rises from 0 V to the supply voltage Vcc, so that the voltage of node N rises to 2 Vcc owing to capacitive coupling. Thereby, a voltage of the output terminal 121 changes to 2 Vcc-Vth. Thereafter, the control signal $\phi_5$ goes to 0 V. By repeating these operations, the supply voltage Vcc can be raised to the voltage of up to 2 Vcc-Vth regardless of a parasitic capacitance of the node N.

The local interconnection used in the above boosting circuit will be described with reference to FIG. 46.

Referring to FIG. 46, a p-type silicon substrate 101 is provided at its main surface with the MOS transistor 108a and MOS diode 108b. The MOS transistor 108a includes n-type impurity regions 105a and 105b, a gate insulating film 103a, a gate electrode 104a and side wall insulating films 106. Titanium silicide layers ($TiSi_2$) 107a and 107b are formed on a top surface of the gate electrode 104a and surfaces of the n-type impurity regions 105a and 105b.

The MOS diode 108b includes n-type impurity regions 105b and 105c, a gate insulating film 103b, a gate electrode 104b, side wall insulating films 106 and a TiN layer 110 forming a local interconnection. The titanium silicide layers 107a and 107b are formed on a surface of the n-type impurity region 105c and a top surface of the gate electrode 104b, respectively.

The TiN layer 110 is formed over a region extending from the top surface of the gate electrode 104b via the surface of the side wall insulating film 106a to the surface of the n-type impurity region 105b. Thereby, the gate electrode 104b and n-type impurity region 105b are electrically connected together. The p-type silicon substrate 101 is provided at its main surface with element isolating and insulating films 102 between which the MOS transistor 108a and MOS diode 108b are located.

The TiN layer 110 directly connects the gate electrode 104b and the n-type impurity region 105b together, without using a contact hole. Therefore, high integration of a pattern layout can be achieved.

Referring to FIGS. 47 to 51, a method of manufacturing the semiconductor device having the above structures will be described below. FIGS. 47 to 51 are cross sections showing 1st to 5th steps in the process of manufacturing the semiconductor device.

Referring first to FIG. 47, the element isolating and insulating films 102 are formed on the main surface of the p-type silicon substrate 101. Then, a thermal oxidation method or the like is used to form an insulating film, on which a polysilicon layer is formed by, for example, the CVD (Chemical Vapor Deposition) method. These insulating layer and polysilicon layer are patterned to form the gate insulating films 103a and 103b as well as the gate electrodes 104a and 104b.

Using the gate electrodes 104a and 104b as well as the element isolating and insulating films 102 as a mask, n-type impurity is implanted into the main surface of the silicon substrate 1 to form the n-type impurity regions 105a, 105b and 105c. Then, an insulating film covering the gate electrodes 104a and 104b are formed on the whole main surface of the silicon substrate 101 by, for example, the CVD method. Anisotropic etching is effected on the insulating film to form the side wall insulating films 106 on side walls of the gate electrodes 104a and 104b.

Referring to FIG. 48, sputtering or the like is carried out to deposit a Ti layer 109 on the whole main surface of the silicon substrate 101. Referring to FIG. 49, an RTA (Rapid Thermal Annealing) processing is effected on the Ti layer 109 at a temperature in the range of 600° C. to 700° C. for 30 seconds. Thereby, at least a surface region of the Ti layer 109 is nitrided to form the TiN layer 110.

Meanwhile, titanium silicide layers 107a and 107b are formed at interfaces between the Ti layer 109 and the n-type impurity regions 105a, 105b and 105c and between the Ti layer 109 and the gate electrodes 104a and 104b, respectively. This technique is generally referred to as Salicide (Self-aligned Salicide). In the Silicide processing, the side wall insulating films 106 serve to isolate the gate electrodes 104a and 104b and the n-type impurity regions 105a, 105b and 105c from each other for preventing short-circuit therebetween.

Referring to FIG. 50, lithography is carried out to form a resist pattern 111 covering a portion at which the local interconnection is to be formed. Referring to FIG. 51, dry etching is effected on the TiN later 110 to pattern the same using the resist pattern 111 as a mask. Then, the resist pattern 111 is removed. Thereby, the local interconnection made of the TiN layer and electrically connecting the gate electrode 104b and the n-type impurity region 105b together is completed.

Instead of the above method, the TiN layer 110 forming the local interconnection may be formed by a following method. After forming the Salicide structure, the surface layer thereof, i.e., TiN layer 110 is removed, and a new TiN layer, which will form the local interconnection, is deposited by sputtering or the like. This method is more general than the method described before. In view of adhesion of the local interconnection to a base, however, the former method is superior to the latter method, because the TiN layer and the titanium silicide layer are formed of independent layers in the latter method.

The semiconductor device having the conventional local interconnection described above, however, suffers from following two problems. A first problem will now be described below. The TiN layer forming the local interconnection is formed over the region extending from the gate electrode 104b via the side wall insulating film 106 to the impurity region 105c.

Since the titanium silicide layers 107a and 107b and the TiN layer 110 are formed by changing composition of the common Ti layer 109, the adhesion strength thereof is relatively large. However, the adhesion strength between the side wall insulating film 106 and the TiN layer 110 is smaller than the above. Since the side wall insulating film 106 and the TiN layer 110 are in contact with each other through a relatively large contact area, the total adhesion strength between the TiN layer 110 and the base is relatively small. Further, the TiN layer 110 has microscopic patterns. From the foregoing, it can be considered that the possibility of separation of the TiN layer 110 is relatively high.

In accordance with high integration, size of the TiN layer 110 decreases, and hence areas of interfaces between the titanium silicide layers 107a and 107b and the TiN layer 110 decrease. As a result, the adhesion strength between the TiN layer and the base further decreases, so that the possibility of separation of the TiN layer 110 forming the local interconnection further increases.

A second problem will be described below. As already described, dry etching is executed to pattern the TiN layer 110, because the TiN layer 110, i.e., local interconnection having a microscopic pattern is liable to be separated if wet etching is used.

Therefore, the dry etching is inevitably used. However, when dry etching is employed, it is necessary to ensure an appropriate etching selectivity with respect to a base, i.e., a layer under the layer to be patterned. That is, a sufficient etching selectivity must be ensured with respect to two kinds of layers of different compositions, i.e., the titanium silicide layers 107a and 107b and the side wall insulating film 106. This results in a difficulty in selecting the etching conditions.

SUMMARY OF THE INVENTION

The present invention has been developed in order to overcome the above problems. An object of the invention is to provide a semiconductor device and a method of manufacturing the same, which can prevent separation of a local interconnection and hence can maintain high reliability even if the device is highly integrated.

Another object of the invention is to provide a method of manufacturing a semiconductor device in which a local interconnection can be formed easily.

According to an aspect of the invention, a semiconductor device includes a silicon substrate of a first conductivity type and having a main surface, an interconnection layer made of material containing silicon and formed on a first region in the main surface of the silicon substrate with an insulating film posed therebetween, an impurity region of a second conductivity type formed at a second region, which is adjacent to the first region, in the main surface of the silicon substrate, a side wall insulating film formed on a portion of a side wall of the interconnection layer except for a first side wall portion of the interconnection layer placed aside the impurity region, and a silicide layer formed in a region extending from a surface layer of the interconnection layer to a surface layer of the impurity region via a position on the first side wall portion.

According to the semiconductor device of the above aspect, the silicide layer forming a local interconnection is formed of a silicide portion at the surface of the interconnection layer and a silicide portion at the surface of the impurity region which are integrally joined together. Therefore, the base under the local interconnection is mostly constituted by the surfaces of the interconnection layer and impurity region. Adhesive strength and area of interface between the surfaces of the interconnection layer and impurity region and the silicide layer can be enlarged. Therefore, disadvantageous separation of the local interconnection can be prevented. Also, a resistance of the local interconnection can be reduced owing to the fact that the local interconnection is made of silicide.

In the above semiconductor device, the side wall insulating film may have a first portion covering at least a surface portion of the insulating film located under the first side wall portion, and the silicide layer may extend over the first portion.

In this semiconductor device, a silicidation at the surface of the insulating film can be prevented. Thereby, a stress, which may be applied to the insulating film from the silicide layer due to the silicidation can be suppressed. Therefore, deterioration of breakdown voltage of the insulating film can be suppressed.

A semiconductor device of another aspect of the invention includes a silicon substrate of a first conductivity type having a main surface, an interconnection layer made of material containing silicon and formed on a first region in the main surface of the silicon substrate with an insulating film posed therebetween, an impurity region of a second conductivity type formed at a second region, which is adjacent to the first region, in the main surface of the silicon substrate, a side wall insulating film covering opposite side walls of the interconnection layer and provided at a surface thereof, which is placed aside the impurity region, with a conductive layer made of material containing silicon, and a silicide layer formed in a region extending from a surface layer of the interconnection layer via a surface layer of the conductive layer to a surface layer of the impurity region.

According to the semiconductor device of the above aspect, the silicide layer forming the local interconnection is formed of silicide portions at the surfaces of the interconnection layer, conductive layer and impurity region, which are integrally joined together. Therefore, similarly to the semiconductor device of the aspect already described, the local interconnection and a base located under the same can have a large contact area in which a large adhesion strength is obtained. As a result, disadvantageous separation of the local interconnection can be prevented.

In a method of manufacturing a semiconductor device of an aspect of the invention, an interconnection layer made of material containing silicon is formed on a first region in a main surface of a silicon substrate of a first conductivity type with an insulating film posed therebetween. An impurity region of a second conductivity type is formed at a second region, which is adjacent to the first region, in the main surface of the silicon substrate. A side wall insulating film covering opposite side surfaces of the interconnection layer is formed. A thickness of a portion of the side wall insulating film placed aside the impurity region is reduced. A refractory metal layer covering the interconnection layer and the impurity region is formed. Heat treatment is effected on the refractory metal layer to form a silicide layer in a region extending from a surface layer of the interconnection layer to a surface layer of the impurity region. A portion of the refractory metal layer which has not been turned into silicide is removed by wet etching.

According to the method of manufacturing the semiconductor device of the above aspect, the thickness of the portion of the side wall insulating film placed aside the predetermined impurity region is reduced. Thereby, a distance between an end, which is adjacent to the predetermined impurity region, of a silicide portion in the surface of the interconnection layer, which is formed by the heat treatment, and an end, which is adjacent to the interconnection layer, of a silicide portion formed in the surface of the impurity region can be made shorter than a distance between the other end of the silicide portion in the surface of the interconnection layer and an end of a silicide portion in a surface of another impurity region. As a result, in a region in which the thickness of the side wall insulating film is reduced, the silicide portion in the surface of the interconnection layer can be connected to the silicide portion in the surface of the predetermined impurity region. Thus, it is possible to form the silicide layer, which forms a local interconnection, in a self-aligned manner simultaneously with formation of the silicide portions in the surfaces of the interconnection layer and impurity region. Thereby, it is not necessary to provide another independent layer for forming the local interconnection. Consequently, it is not necessary to effect etching for forming a microscopic interconnection pattern made of material different from silicide, which has been required in the prior art. Thereby, wet etching can be used to form the local interconnection. Also, the local interconnection can be formed of the silicide layer in a self-aligned manner, so that the local interconnection can be formed easily even in a highly integrated semiconductor device.

In a method of manufacturing a semiconductor device of another aspect of the invention, an interconnection layer made of material containing silicon is formed on a first region in a main surface of a silicon substrate of a first conductivity type with an insulating film posed therebetween. An impurity region of a second conductivity type is formed at a second region, which is adjacent to the first region, in the main surface of the silicon substrate. A first insulating layer covering the interconnection layer and the impurity region is formed. A conductive layer, which contains silicon and is located on a side wall of the interconnection layer placed aside the impurity region, is formed on the first insulating layer. Etching is effected on the first insulating layer to expose a top surface of the interconnection layer and a surface of the impurity region and form a side wall insulating film on the side wall of the interconnection layer. A refractory metal layer covering the interconnection layer, the conductive layer and the impurity region is formed. Heat treatment is effected on the refractory metal layer to form a silicide layer in a region extending from a surface layer of the interconnection layer to a surface layer of the impurity region. A portion of the refractory metal layer which has not been turned into silicide is removed by wet etching.

According to the method of manufacturing the semiconductor device of the above aspect, the conductive layer containing silicon is formed on the surface of the predetermined side wall insulating film, and the surfaces of the interconnection layer, conductive layer and impurity region are covered with the refractory metal layer. Heat treatment is effected on the refractory metal layer, whereby the silicide layer can be formed in the region extending from the surface of the interconnection layer via the surface of the conductive layer to the surface of the impurity region. Also in this case, the portion of the refractory metal layer which has not been turned into silicide can be removed by wet etching. Thereby, the interconnection layer can be easily formed similarly to the method described before. Also, by appropriately selecting material of the conductive layer, heat treatment for the silicidation can be carried out at a lower temperature. This enlarges a manufacturing margin.

In a method of manufacturing a semiconductor device of still another aspect of the invention, an interconnection layer made of material containing silicon is formed on a first region in a main surface of a silicon substrate of a first conductivity type with an insulating film posed therebetween. An impurity region of a second conductivity type is formed at a second region, which is adjacent to the first region, in the main surface of the silicon substrate. A side wall insulating film covering opposite side walls of the interconnection layer is formed. A refractory metal layer is formed on the interconnection layer, the impurity region and the side wall insulating film. A TiN layer is formed on a surface of the refractory metal layer. A portion of the TiN layer placed aside the impurity region is removed. Heat treatment is effected on the refractory metal layer to form a silicide layer in a region extending from a surface layer of the interconnection layer to a surface layer of the impurity region. Wet etching is effected to remove portions of the TiN layer and the refractory metal layer which have not been turned into silicide.

According to the method of manufacturing the semiconductor device of the above aspect, the TiN layer is left on a region in which growth of silicide is to be suppressed. The TiN layer serves to suppress growth of silicide located thereunder, which is described in Jun. 9–10, 1992, *VMIC Conference*, pp.267–273. As described above, it is formed on the portion other than the portion on which the local interconnection is to be formed, and in other words, the TiN layer is formed on the portion in which growth of the silicide is to be suppressed, so that the growth of the silicide under the TiN layer can be suppressed. Thereby, the local interconnection can be formed by a silicide portion at the surface of the interconnection layer and a silicide portion at the surface of the impurity region which are grown to join with each other in a region in which the TiN layer is not formed. Also in this case, the TiN layer and the portion of the refractory metal layer which has not been turned into silicide can be removed by wet etching. Similarly to the method already described, the local interconnection can therefore be formed more easily than the prior art.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Embodiments of the invention will be described below with reference to FIGS. 1 to 44.

First Embodiment

Figure 1:
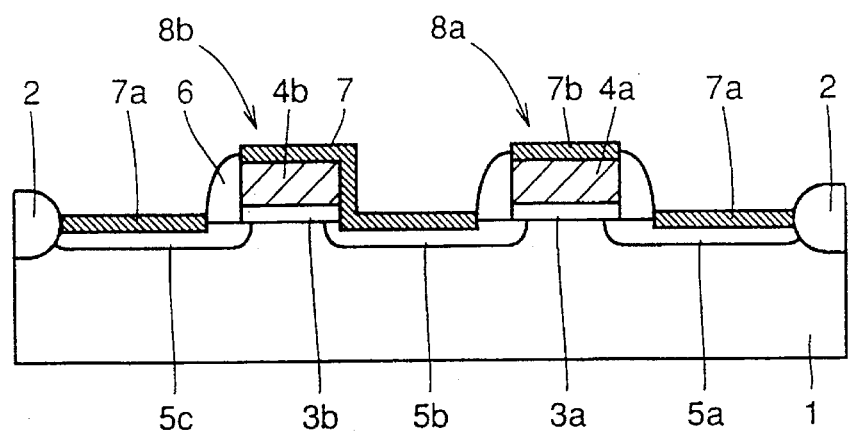
FIG. 1 is a cross section showing a semiconductor device of a first embodiment of the invention.
Figure 46:
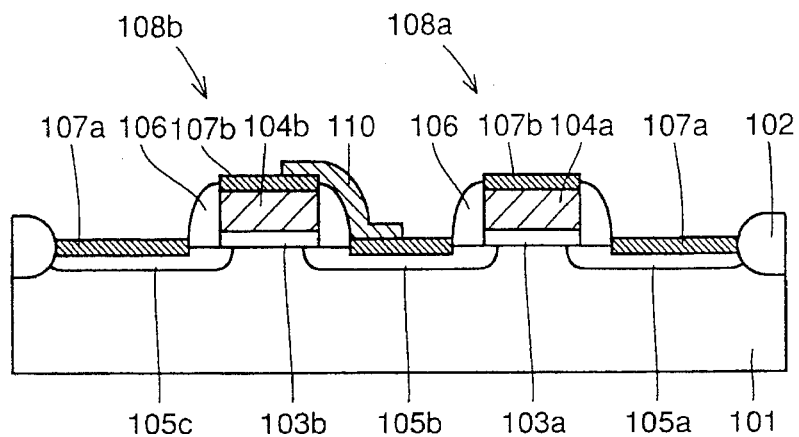
FIG. 46 is a cross section showing a region 100 in the semiconductor device shown in FIG. 45.
Figure 47:
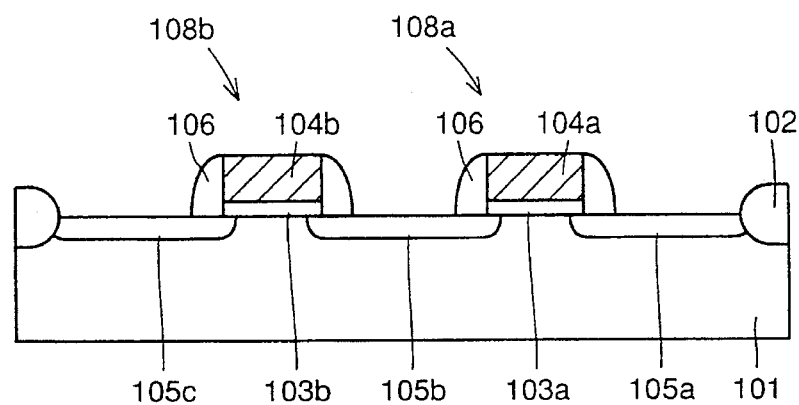
FIGS. 47–51 are cross sections showing 1st to 5th steps in a process for manufacturing the semiconductor device including the conventional local interconnection, respectively.
Figure 48:
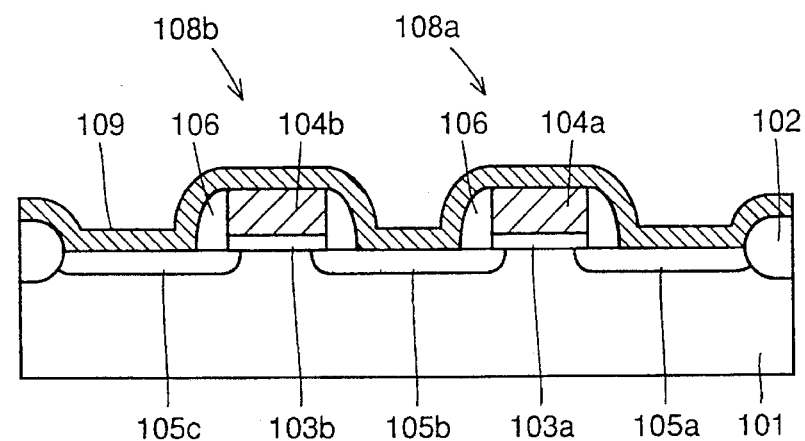
Figure 49:
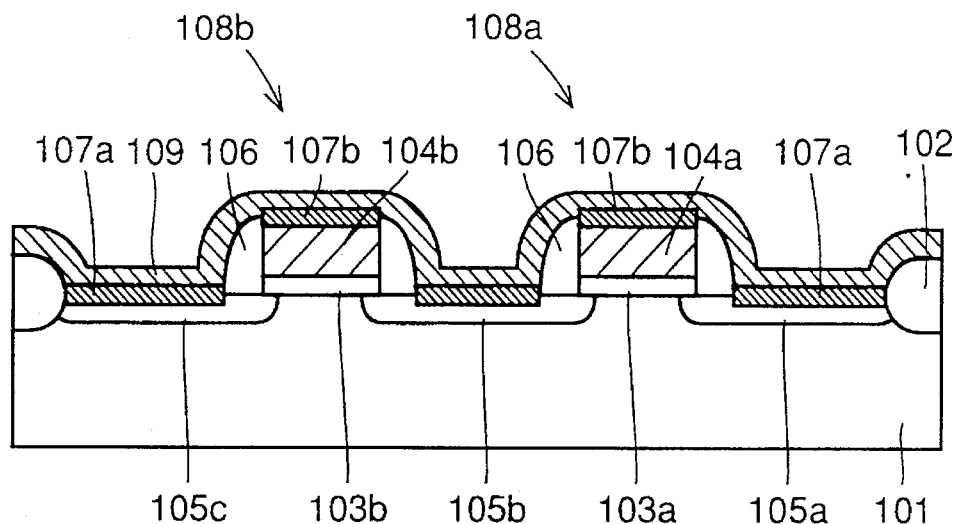
Figure 50:
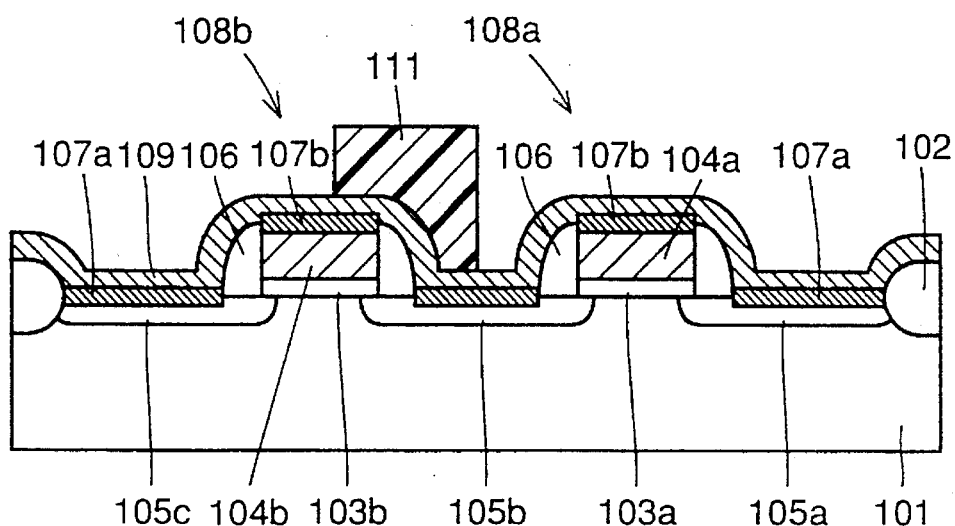
Figure 51:
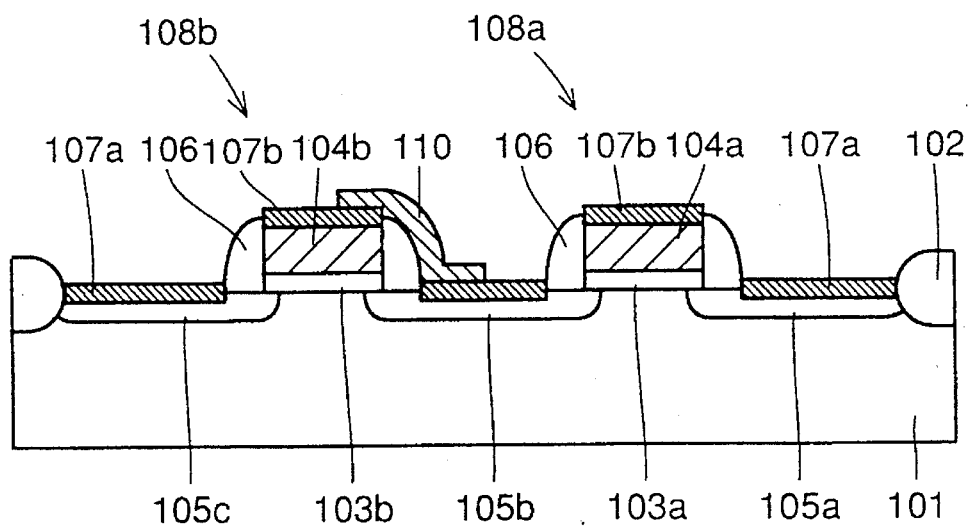

A first embodiment of the invention will be described below with reference to FIGS. 1–11. FIG. 1 is a schematic cross section of a semiconductor device of the first embodiment of the invention, and corresponds to FIG. 46 showing the prior art. Structures of the semiconductor device of the first embodiment will now be described below with reference to FIG. 1.

In FIG. 1, a p-type silicon substrate 1 is provided at its main surface with an MOS diode 8b and an MOS transistor 8a. The structures of the semiconductor device of the embodiment differ from those of the semiconductor device in the prior art in that the MOS diode 8b includes a portion from which a side wall insulating film 6 is selectively removed, and that a titanium silicide layer 7 forming a local interconnection is formed on the portion from which the side wall insulating film 6 is removed. Other structures of the embodiment are similar to those in the prior art.

More specifically, the p-type silicon substrate 1 is provided at predetermined regions in the main surface with element isolating and insulating films 2. The element isolating and insulating films 2 surround a region in which the MOS transistor 8a and MOS diode 8b are formed. The MOS transistor 8a includes n-type impurity regions 5a and 5b, a gate insulating film 3a and a gate electrode 4a made of, for example, polysilicon. The side wall insulating films 6 are formed at opposite side walls of the gate electrode 4a.

The MOS diode 8b includes n-type impurity regions 5b and 5c, a gate insulating film 3b and a gate electrode 4b, made of, for example, polysilicon. A titanium silicide layer 7a is formed in the surfaces of the n-type impurity regions 5a and 5c. A titanium silicide layer 7b is formed in the top surface of the gate electrode 4a.

A titanium silicide layer 7 is formed in a region extending from a surface layer of the gate electrode 4b to a surface layer of the n-type impurity region 5b. The titanium silicide layer 7 is formed of silicide portions which are provided at the surfaces of the gate electrode 4b and n-type impurity region 5b and are integrally joined together.

Therefore, it is not necessary to provide a new independent layer such as a TiN layer for electrically connecting the gate electrode 4b and n-type impurity region 5b to each other. Thereby, even if degree of integration further increases, a large adhesive strength can be ensured between the local interconnection and a base located under the same. As a result, disadvantageous separation of the local interconnection can be prevented. Also, high integration can be achieved easily because a new layer forming the local interconnection is not required.

Figure 2:
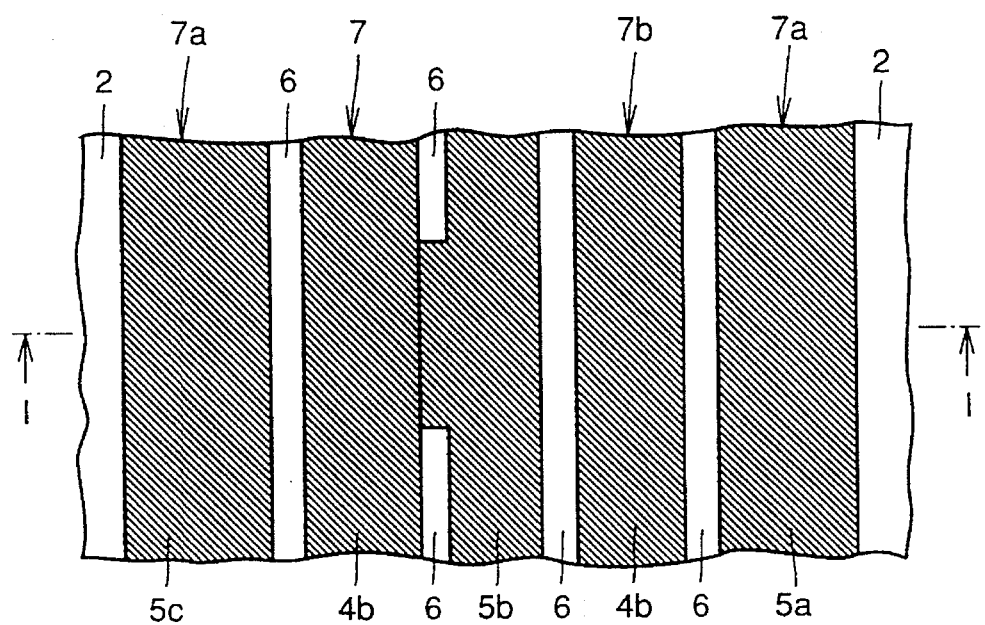
FIG. 2 is a schematic plan showing the semiconductor device shown in FIG. 1.

Planar layout of the semiconductor device shown in FIG. 1 will be described below with reference to FIG. 2. FIG. 2 is a schematic plan showing planar layout of the semiconductor device shown in FIG. 1. Referring to FIG. 2, only a portion of the side wall insulating film 6 located between the gate electrode 4b and the n-type impurity region 5b is removed. It is therefore possible to form the titanium silicide layer 7, i.e., local interconnection in the portion from which the side wall insulating film 6 is removed.

Referring to FIGS. 3 to 7, a method of manufacturing the semiconductor device shown in FIG. 1 will be described below. FIGS. 3 to 7 are cross sections showing 1st to 5th steps in a process for manufacturing the semiconductor device of the embodiment, respectively.

Figure 3:
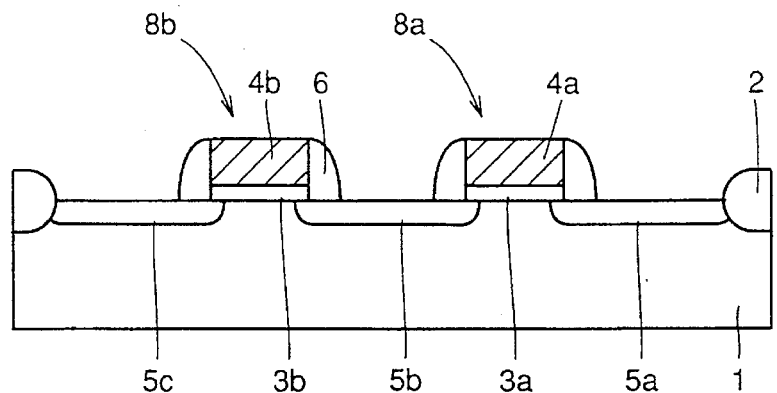
FIGS. 3–7 are cross sections showing 1st to 5th steps in a process of manufacturing the semiconductor device of the first embodiment of the invention, respectively.
Figure 4:
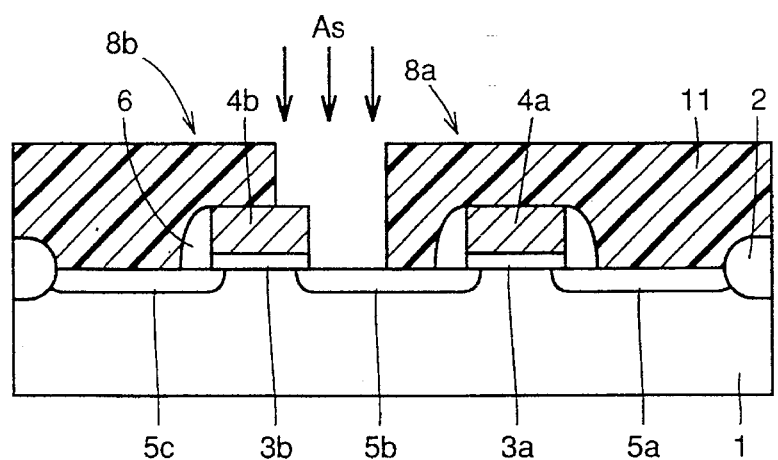

Referring first to FIG. 3, steps similar to those in the prior art are executed to form in the main surface of the p-type silicon substrate 1 the element isolating and insulating films 2, gate insulating films 3a and 3b, gate electrodes 4a and 4b, n-type impurity regions 5a, 5b and 5c, and side wall insulating films 6. Then, a resist is applied to the whole main surface of the p-type silicon substrate 1. The resist is patterned by lithography to form a resist pattern 11 exposing a portion of the side wall insulating film 6 in a region in which the local interconnection is to be formed. Using the resist pattern 11 as a mask, the side wall insulating film 6 is selectively removed. Thereafter, the resist pattern 11 is removed.

Figure 5:
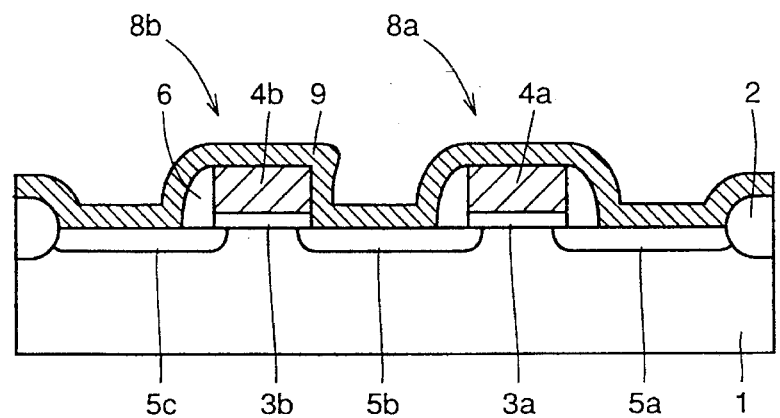
Figure 6:
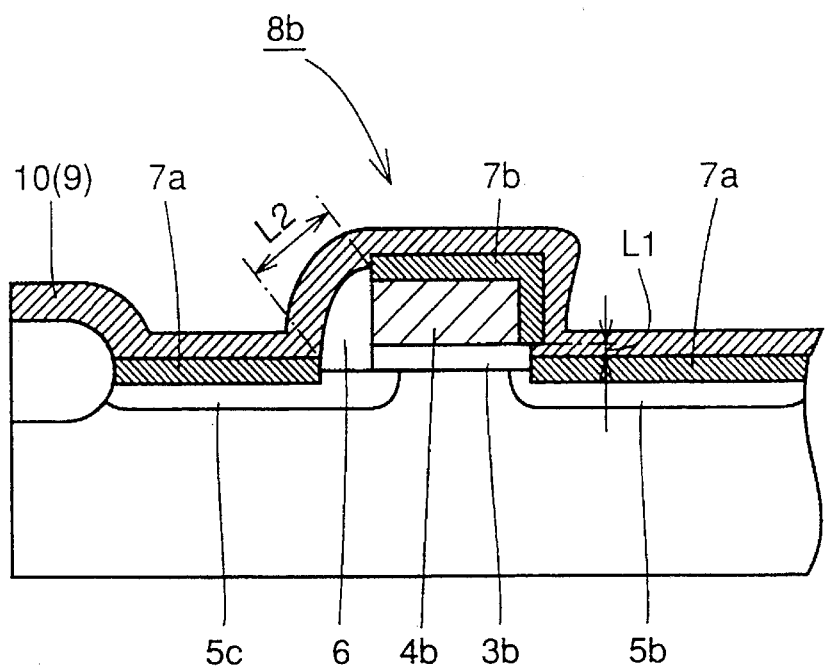

Referring to FIG. 5, a Ti layer 9 is deposited on the whole main surface of the p-type silicon substrate 1 by the sputtering method. In this state, a first RTA processing is executed. Referring to FIG. 6, heat treatment is executed in nitrogen atmosphere at a temperature between 600° C. to 700° C. for 30 seconds to 1 minute, whereby titanium silicide layers 7b and 7a are formed on the surface of the gate electrode 4b and the surfaces of the n-type impurity regions 5b and 5c, respectively.

Thereby, the surface of the Ti layer 9 is nitrided so that a TiN layer 10 is formed in the surface layer thereof. A distance L1 between the titanium silicide layer 7b and the titanium silicide layer 7a located in the region from which the side wall insulating film 6 is removed is shorter than a distance L2 between the titanium silicide layer 7b and the titanium silicide layer 7a located in the region in which the side wall insulating film 6 remains.

Therefore, the titanium silicide layer 7 functioning as the local interconnection can be formed only in the region from which the side wall insulating film 6 is removed. The titanium silicide layer 7 which will form the local interconnection shown in FIG. 1 can be formed simply by the first RTA processing in some cases, if the gate insulating film 3b has an appropriate thickness. This is owing to the fact that the distance L1 is very small and is nearly equal to the thickness of the gate insulating film 3b.

Figure 7:
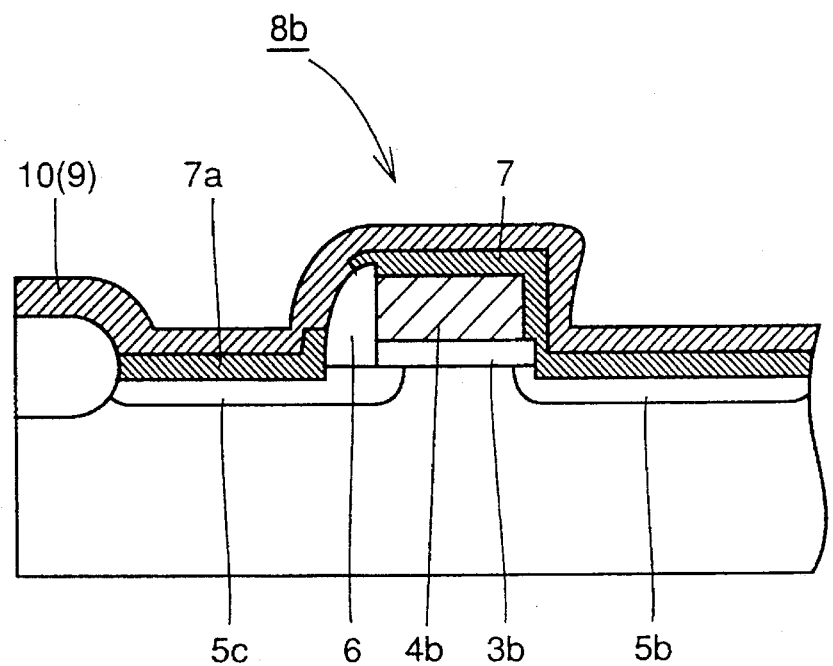

Referring to FIG. 7, a second RTA processing is executed to complete the titanium silicide layer 7 forming the local interconnection. More specifically, the titanium silicide layer 7a at the surface of the n-type impurity region 5b is joined to the titanium silicide layer 7b at the surface of the gate electrode 4b through the region from which the side wall insulating film 6 is removed, whereby the titanium silicide layer 7 is completed. The second RTA processing is executed in the nitrogen atmosphere at a temperature of 700° C. or more for a time period of 15 seconds to 1 minute.

After the titanium silicide layer 7 was formed in this manner, the TiN layer 10 or the not-yet reacted layer 9 is removed by wet etching. In this embodiment, it is not necessary to execute etching for leaving a microscopic pattern of TiN as the local interconnection, so that wet etching can be employed. Thereby, a problem of the prior art in which disadvantageous dry etching is inevitable can be overcome.

Referring to FIGS. 8–11, a modification of the first embodiment will be described below. In the first embodiment, the impurity regions 5a, 5b and 5c of the MOS transistor 8a and MOS diode 8b consist of high-concentration impurity regions. However, the n-type impurity regions may have an LDD (Lightly Doped Drain) structure.

Figure 8:
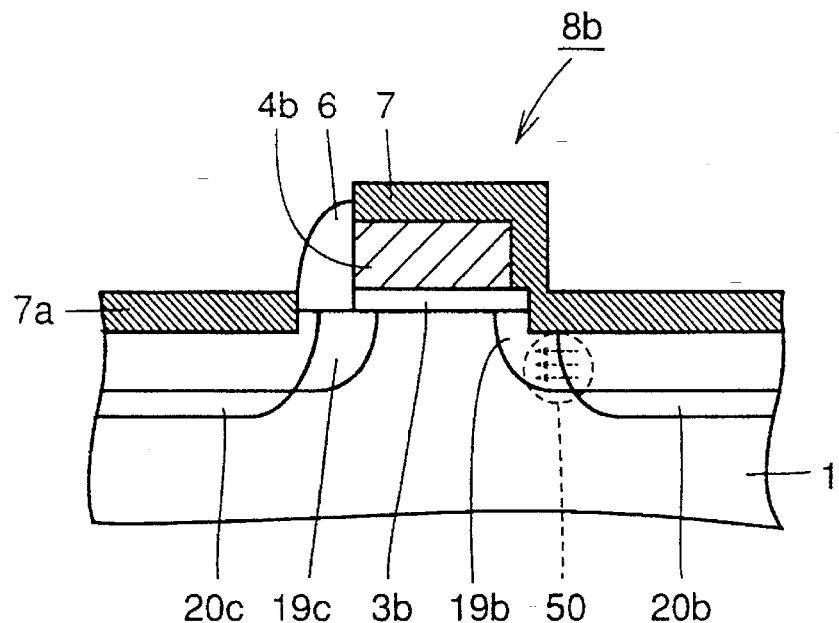
FIG. 8 is a cross section showing a possible problem caused when an LDD structure is employed in an impurity region of the semiconductor device of the first embodiment.

FIG. 8 is a schematic cross section showing a semiconductor device corresponding to that of the first embodiment but including n-type impurity regions having the LDD structure. Referring to FIG. 8, if the n-type impurity regions are simply adapted to have the LDD structure in the semiconductor device of the first embodiment, the following problem might arise.

Referring to FIG. 8, the p-type silicon substrate 1 is provided at its main surface with n-type low-concentration impurity regions 19c and 19b as well as n-type high-concentration impurity regions 20b and 20c. The titanium silicide layer 7 is formed over the high-concentration impurity region 20b and the low-concentration impurity region 19b. Thus, the titanium silicide layer 7 is formed on a region 50 having a concentration gradient. Thereby, a leak current is liable to generate in this region 50. In view of this, the following modification has been devised.

The modification will be described below with reference to FIGS. 9–11, which are cross sections showing distinctive 1st to 3rd steps in a manufacturing process of the modification, respectively.

Figure 9:
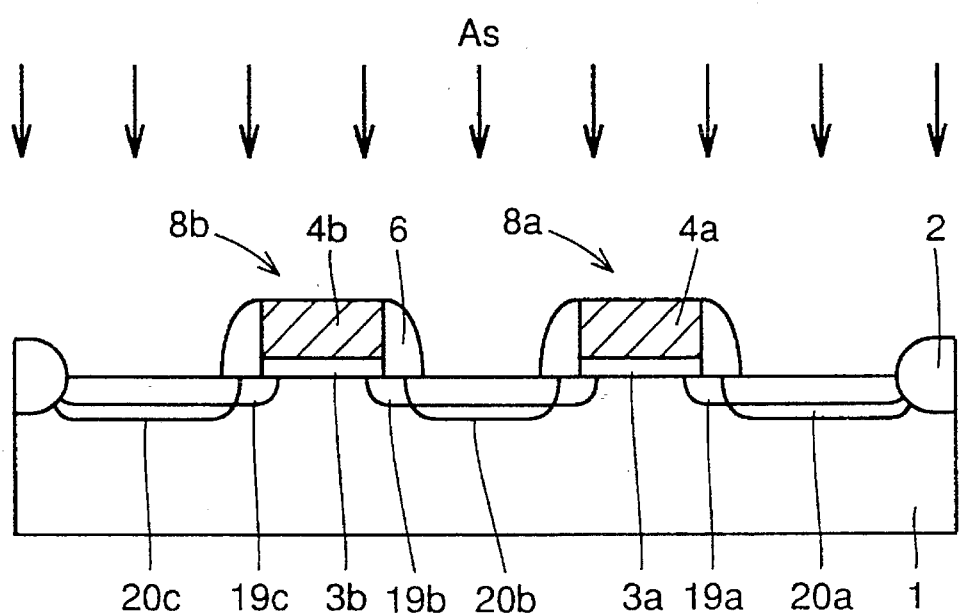
FIGS. 9–11 are cross sections showing distinctive 1st to 3rd steps in a modification of a manufacturing process of the first embodiment, respectively.

Referring to FIG. 9, steps from the start to formation of the side wall insulating films 6 are executed similarly to the first embodiment. The low-concentration impurity regions 19a, 19b and 19c are formed by implantation of impurity such as As or P under the conditions of 50 KeV to 150 KeV and $10^{13}/cm^2$. The high-concentration impurity regions 20a, 20b and 20c are formed by ion-implanting As into the main surface of the p-type silicon substrate 1 under the conditions of 40 KeV and $10^{15}/cm^2$ using the gate electrodes 4a and 4b as well as the side wall insulating film 6 as a mask.

Figure 10:
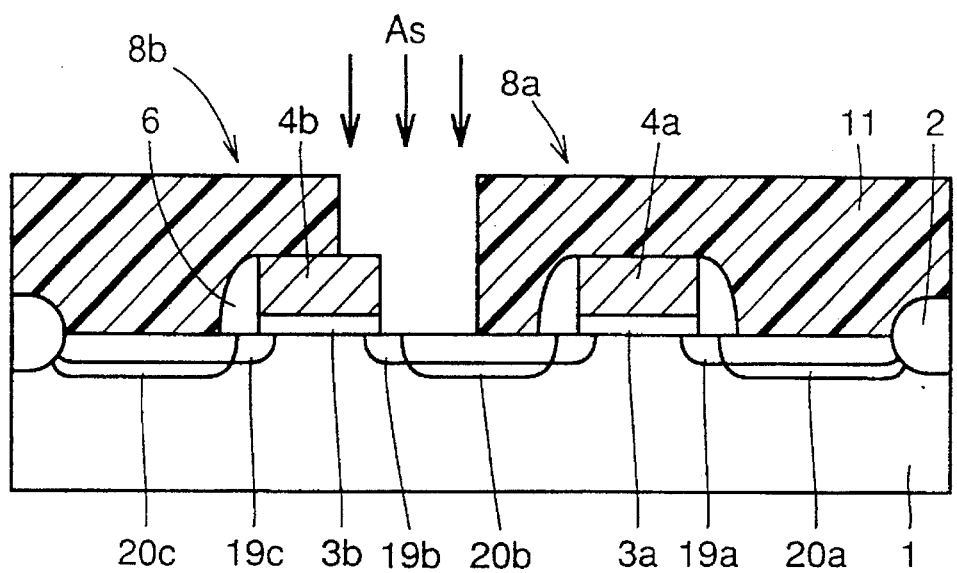

Referring to FIG. 10, a resist pattern 21 is formed similarly to the first embodiment. The resist pattern 21 exposes a portion of the side wall insulating film 6 occupying a region in which the local interconnection is to be formed. Using the resist pattern 21 as a mask, the side wall insulating film 6 is selectively removed. Thereafter, using the resist pattern 21 as a mask, As is implanted into the main surface of the p-type silicon substrate 1 under the conditions of 40 KeV and $10^{14}$ to $10^{15}/cm^2$. This increases the concentration of the low-concentration impurity region 19b which is exposed on the main surface of the p-type silicon substrate 1. Thereafter, the resist pattern 21 is removed.

Figure 11:
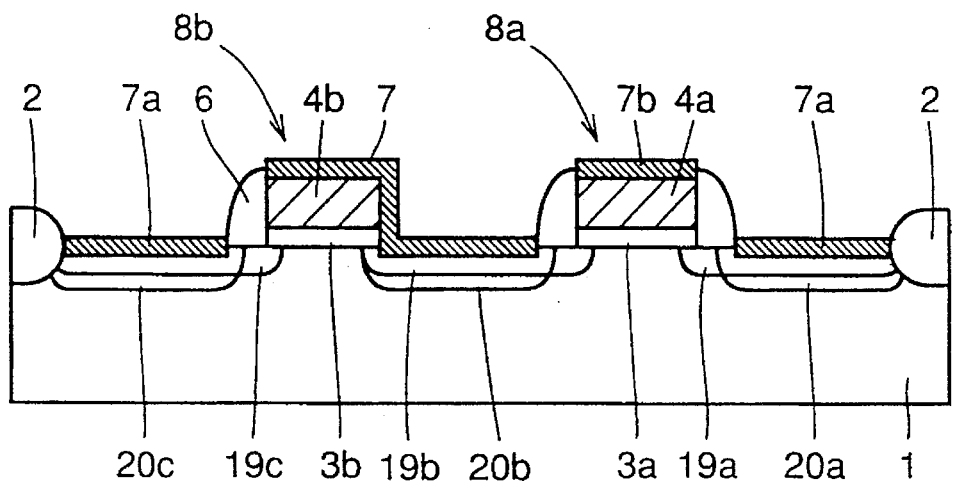

Referring to FIG. 11, the titanium silicide layers 7, 7a and 7b are formed by steps similar to those in the first embodiment. Owing to this, the portion having a concentration gradient shown in FIG. 8 does not exist under the titanium silicide layer 7. Therefore, a problem of generation of a leak current can be overcome.

Second Embodiment

Figure 12:
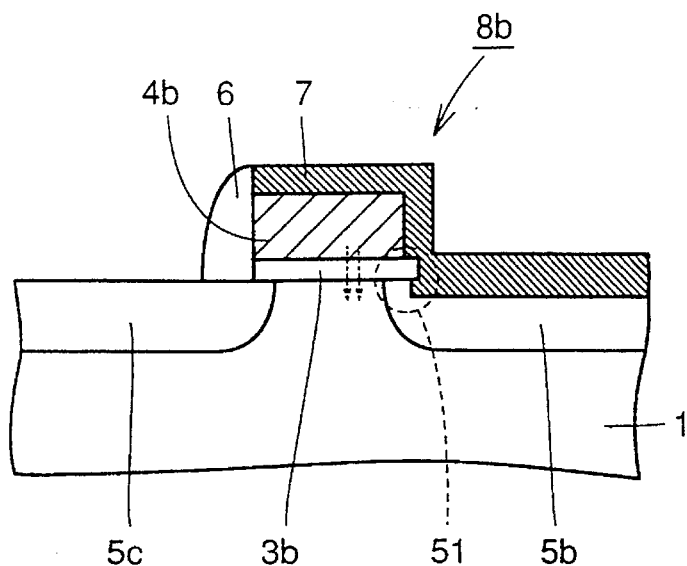
FIG. 12 is a cross section showing a possible problem of the first embodiment.

Referring to FIGS. 12 to 18, a second embodiment of the invention will be described below. This embodiment is a modification of the first embodiment. FIG. 12 is an enlarged cross section of the MOS diode 8b in the first embodiment. Referring to FIG. 12, the first embodiment already described includes the titanium silicide layer 7 which is in direct contact with the surface of the gate insulating film 3b. This titanium silicide layer 7 grows along a portion of the surface of the gate insulating film 3b.

In accordance with this growth, a stress is applied from the titanium silicide layer 7 to the gate insulating film 3b through a region 51 including a contact between the titanium silicide layer 7 and gate insulating film 3b. This may cause distortion in the gate insulating film 3b, resulting in possible decrease of the breakdown voltage of the gate insulating film 3b. As a result, a leak current is liable to generate between the gate electrode 4b and the p-type silicon substrate 1. In view of the above, the second embodiment has been devised.

Figure 13:
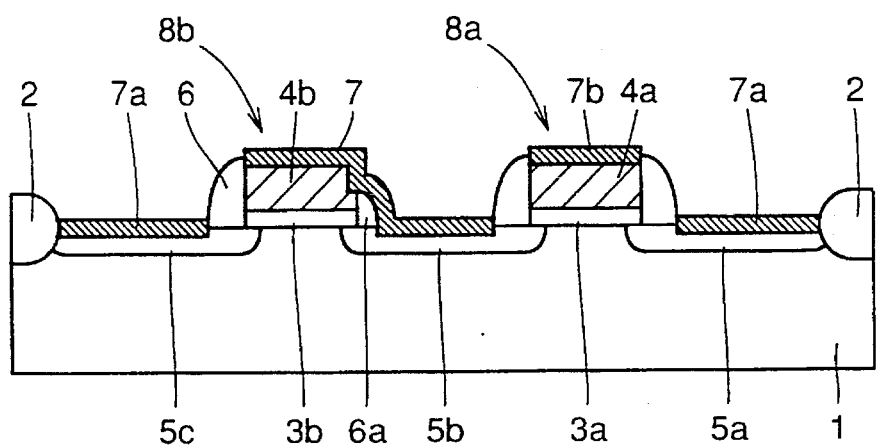
FIG. 13 is a cross section showing a semiconductor device of a second embodiment of the invention.

FIG. 13 is a cross section showing a semiconductor device of the second embodiment. Referring to FIG. 13, the second embodiment differs from the first embodiment in that a side wall insulating film 6a of which thickness is reduced remains between the titanium silicide layer 7 and the gate insulating film 3b. Thereby, the titanium silicide layer 7 is not in direct contact with the gate insulating film 3b. Therefore, it is possible to suppress the stress applied from the titanium silicide layer 7 as compared with the first embodiment. Accordingly, deterioration of the breakdown voltage of the gate insulating film 3b can be suppressed. Other structures are similar to those of the first embodiment shown in FIG. 1.

Figure 14:
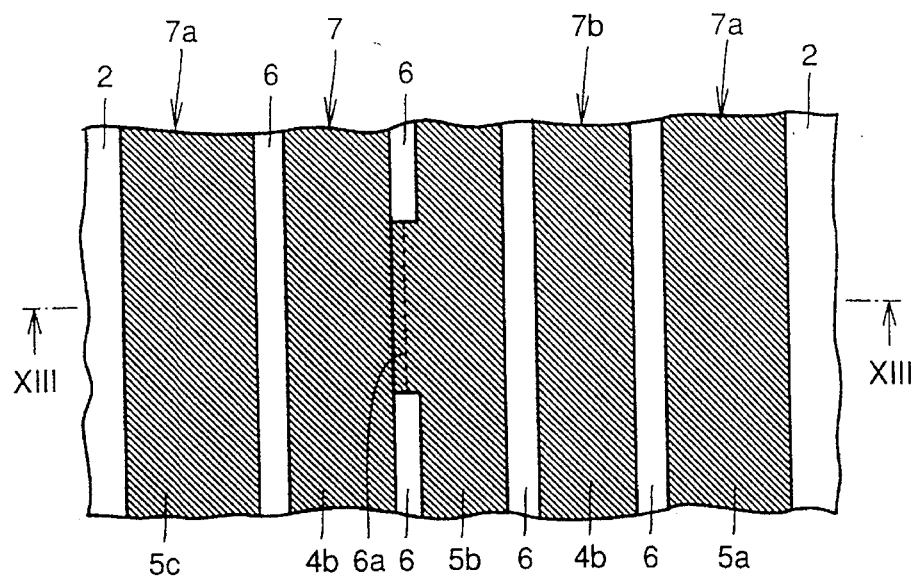
FIG. 14 is a schematic plan of the semiconductor device shown in FIG. 13.

FIG. 14 is a schematic plan of the semiconductor device shown in FIG. 13. In the second embodiment, as shown in FIG. 14, the side wall insulating film 6a of which thickness is reduced remains under the titanium silicide layer 7 functioning as the local interconnection.

Figure 15:
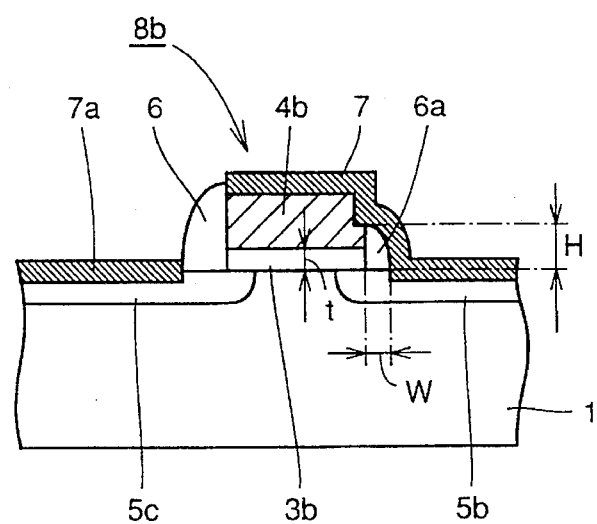
FIG. 15 is an enlarged cross section of an MOS diode in FIG. 13.

FIG. 15 is an enlarged cross section of the MOS diode 8b in FIG. 13. Structures of the MOS diode 8b will be described below in detail with reference to FIG. 15. The side wall insulating film 6a covers the surface of the gate insulating film 3b. The side wall insulating film 6 has a thickness of about 50 Å to about 200Å, and preferably has a height H of about 300Å to about 700Å. The side wall insulating film 6a is in contact with the main surface of the p-type silicon substrate 1 through a width W which is preferably in a range from about 200Å to about 700Å. Owing to the fact that the side wall insulating film 6a remains, the stress applied from the titanium silicide layer 7 to the gate insulating film 3b can be suppressed.

Figure 16:
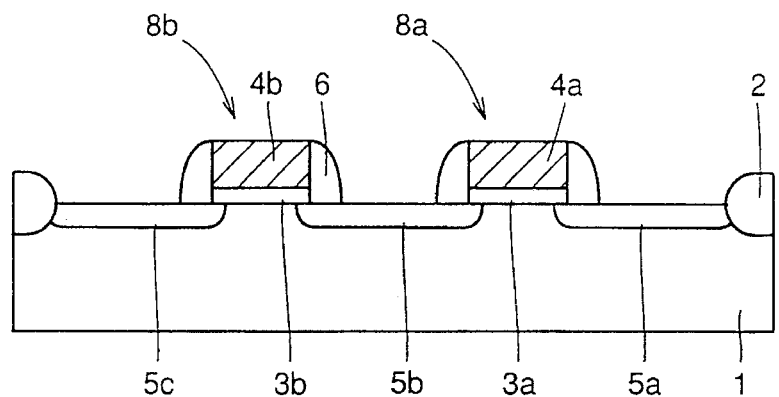
FIGS. 16–18 are cross sections showing 1st to 3rd steps in a method of manufacturing the semiconductor device of the second embodiment of the invention, respectively.
Figure 17:
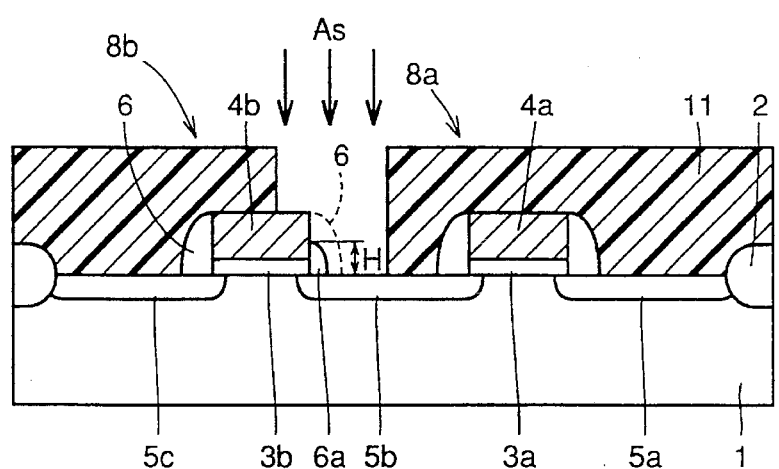
Figure 18:
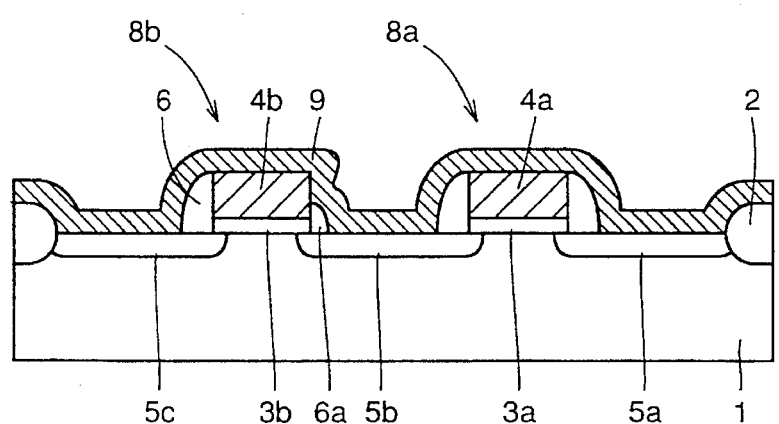

Referring to FIGS. 16 to 18, a method of manufacturing the semiconductor device of this embodiment will be described below. FIGS. 16 to 18 are cross sections showing 1st to 3rd steps in a process of manufacturing the semiconductor device of this embodiment, respectively.

Referring to FIG. 16, steps from the start to formation of the side wall insulating films 6 are carried out similarly to the first embodiment. Referring to FIG. 17, the resist pattern 12 is formed exposing a local interconnection forming region in which the local interconnection is to be formed. Using the resist pattern 12 as a mask, anisotropic etching is effected on a portion of the side wall insulating film 6 located in the local interconnection forming region. Thereby, the side wall insulating film 6a having the reduced thickness is formed. In this processing, the height H of the side wall insulating film 6a is controlled by appropriately controlling etching conditions such as an etching time. Thereafter, the resist pattern 12 is removed.

Referring to FIG. 18, a sputtering method or the like is used to form the Ti layer 9 on the whole main surface of the p-type silicon substrate 1. Thereafter, steps similar to those in the first embodiment are carried out to complete the semiconductor device shown in FIG. 13.

Third Embodiment

Figure 19:
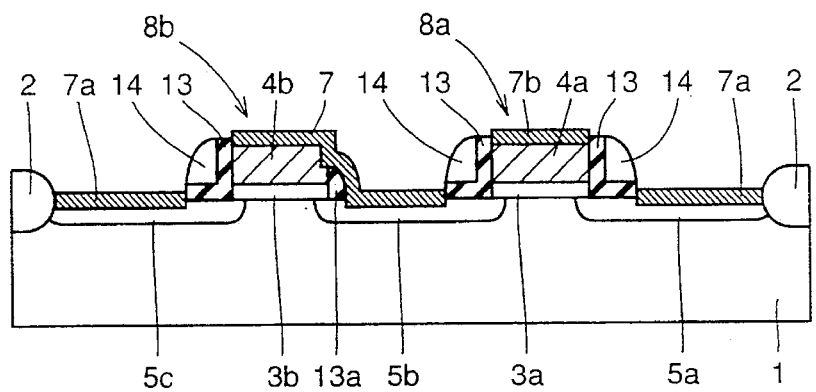
FIG. 19 is a cross section showing a semiconductor device of a third embodiment of the invention.

Referring to FIGS. 19 to 29, a third embodiment of the invention will be described below. FIG. 19 is a cross section showing a semiconductor device of the third embodiment of the invention. This embodiment is a modification of the second embodiment. More specifically, the side wall insulating film located in a region in which the local interconnection is not formed has a two-layer structure including first and second insulating films 13 and 14. Other structures are similar to those of the semiconductor device of the second embodiment.

Referring to FIGS. 20 to 23, a method of manufacturing the semiconductor device of the third embodiment will be described below. FIGS. 20 to 23 are cross sections showing 1st to 4th steps in a process of manufacturing the semiconductor device of the third embodiment, respectively.

Figure 20:
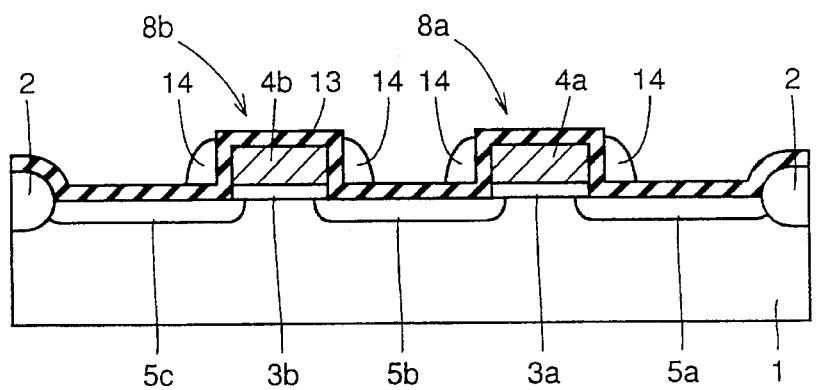
FIGS. 20–23 are cross sections showing 1st to 4th steps in a method of manufacturing the semiconductor device of the third embodiment of the invention, respectively.

Referring first to FIG. 20, steps from the start to formation of the n-type impurity regions 5a, 5b and 5c are carried out similarly to the first embodiment. Then, the CVD method or the like is used to form a silicon oxide film (first insulating film) 13 of about 100Å to about 300Å in thickness on the whole main surface of the p-type silicon substrate 1.

The CVD method or the like is used to form a silicon nitride film (second insulating film) 14 of about 1000Å to about 1500Å in thickness on the silicon oxide film 13. Anisotropic etching is effected on the silicon nitride film 14 to leave the silicon nitride films 14 on the side walls of the gate electrodes 4a and 4b. In this processing, since the silicon oxide film 13, i.e., first insulating film functions as an etching stopper, the etching effected on the silicon nitride film (second insulating film) 14 does not substantially cause damage to the main surface of the p-type silicon substrate 1.

Figure 21:
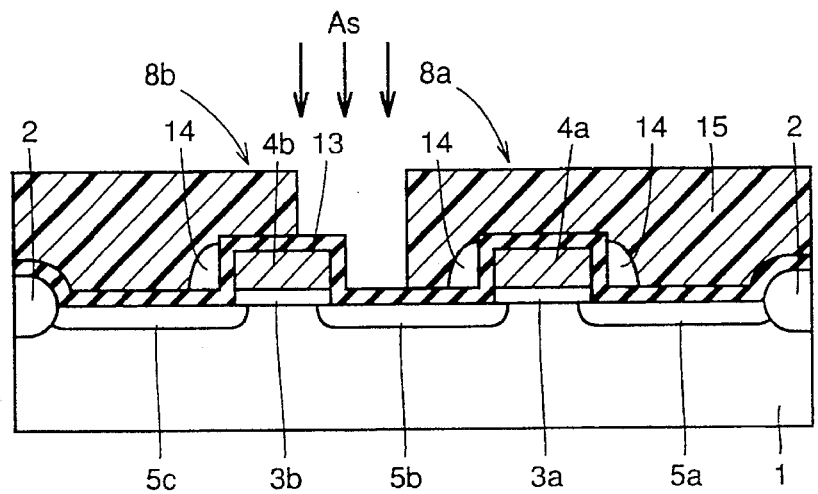

Referring to FIG. 21, one forms a resist pattern 15 which is patterned to expose portions of the second and first insulating films 14 and 13 located on the local interconnection forming region. Using the resist pattern 15 as a mask, the second insulating film 14 is selectively removed. Thereafter, the resist pattern 15 is removed.

Figure 22:
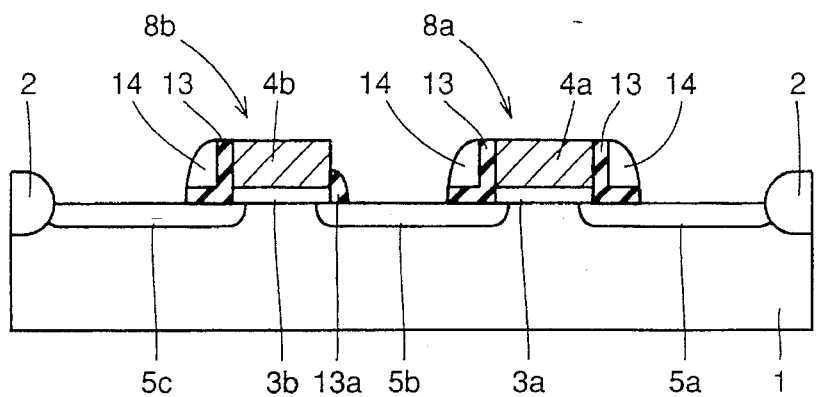

Referring to FIG. 22, anisotropic etching is effected on the first insulating film 13 to leave a first side wall insulating film 13a on the local interconnection forming region. In this processing, since the first insulating film 13 is as thin as about 100Å to about 300Å in thickness, damage by the anisotropic etching to a base can be suppressed. The thickness of the first insulating film 13 can be decreased independently from the width which is required for the function as the side wall insulating film. Thereby, controllability of the processing of exposing an upper side wall portion of the gate electrode 4b can be improved.

Figure 23:
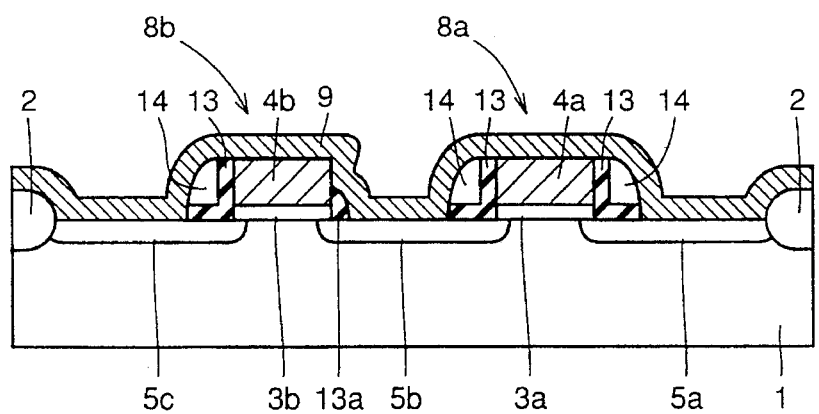

Referring to FIG. 23, sputtering method or the like is used to deposit the Ti layer 9 on the whole main surface of the p-type silicon substrate 1. Thereafter, steps similar to those of the first embodiment are carried out to complete the semiconductor device shown in FIG. 19.

Figure 24:
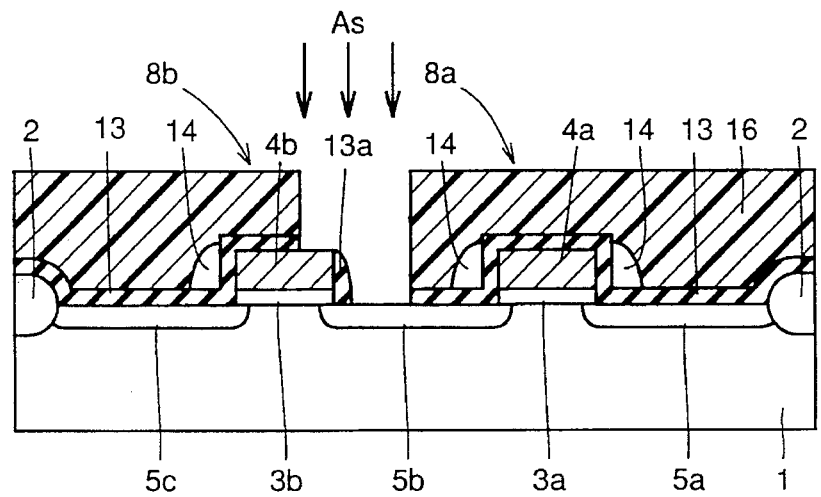
FIGS. 24 and 25 are cross sections showing 2nd and 3rd steps in a modification of the manufacturing process of the third embodiment, respectively.
Figure 25:
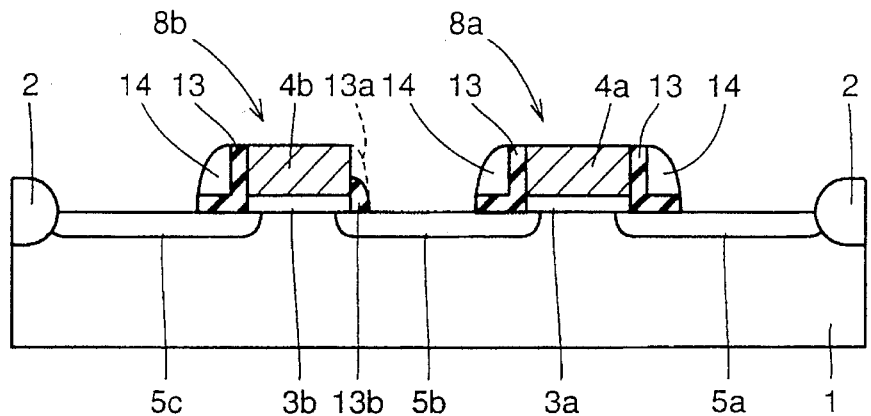

Referring to FIGS. 24 and 25, a modification of the method of manufacturing the semiconductor device of this embodiment will be described below. FIGS. 24 and 25 are cross sections showing 2nd and 3rd steps in the modification of the method of manufacturing the semiconductor device of the embodiment.

Referring first to FIG. 24, after forming the structures similar to those shown in FIG. 21, anisotropic etching is effected on the first insulating film 13 using the resist pattern 15 as a mask. Thereby, the first insulating film 13a is formed on the side wall of the gate electrode 4b. Thereafter, the resist pattern 15 is removed.

Referring to FIG. 25, anisotropic etching is effected on the first insulating films 13 and 13a using the second insulating film 14 as a mask. Thereby, a first insulating film 13b, which has a reduced thickness and covers only a lower portion of the gate electrode 4b, is formed in the local interconnection forming region.

Thereafter, steps similar to those in the first embodiment are carried out to complete the semiconductor device shown in FIG. 19. In this modification, the first insulating film 13a in the local interconnection forming region is processed in advance to be left on the side wall portion of the gate electrode 4b. Therefore, controllability in exposing the upper side wall portion of the gate electrode 4b is further improved.

Figure 26:
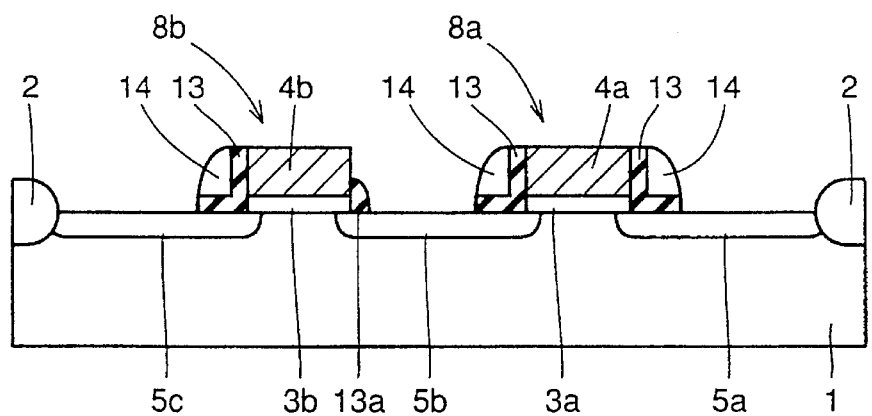
FIGS. 26–28 are cross sections showing distinctive 1st to 3rd steps in a modification of the manufacturing process of the third embodiment, respectively.
Figure 27:
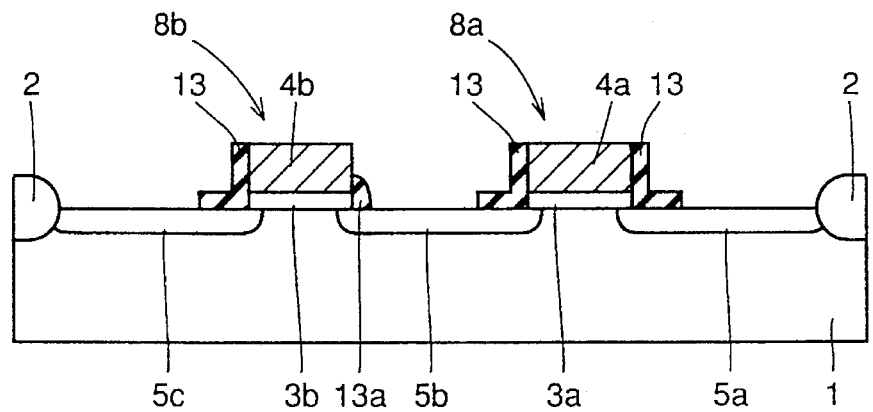
Figure 28:
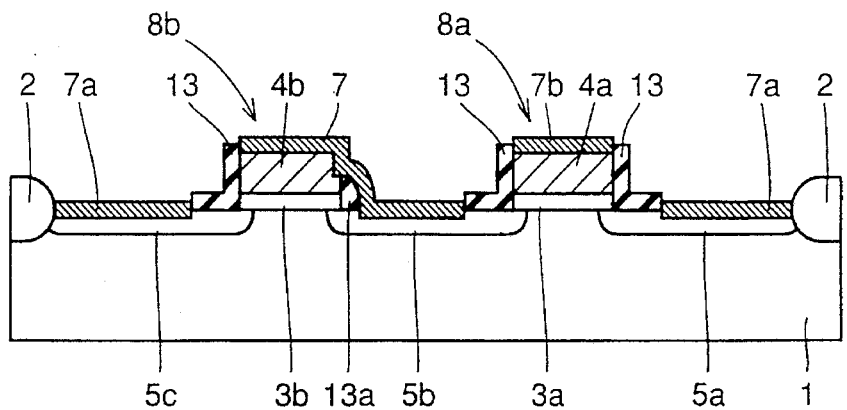

Referring to FIGS. 26 to 29, another modification of the embodiment will be described below. FIGS. 26 to 28 are cross sections showing 1st to 3rd steps in this modification.

Referring to FIG. 26, structures shown in FIG. 22 are obtained through steps similar to those described before. Referring to FIG. 27, the second insulating film 14 is entirely removed. Then, steps similar to those in the first embodiment are carried out to form the titanium silicide layers 7, 7a and 7b as shown in FIG. 28.

Figure 29:
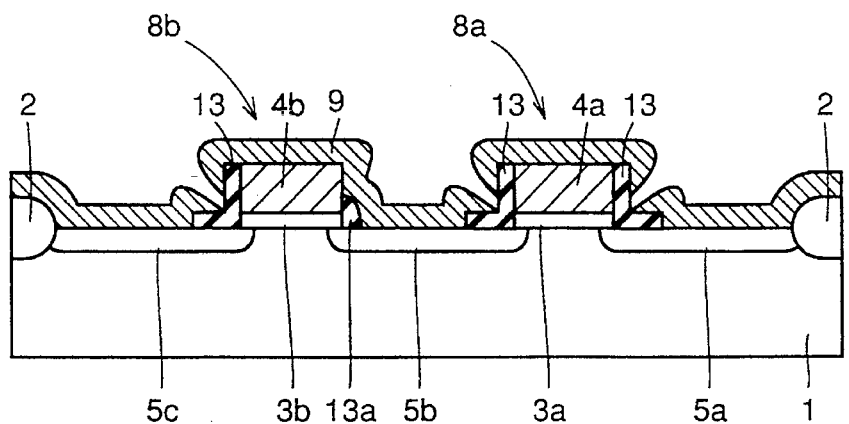
FIG. 29 is a cross section showing a state in which a Ti layer is formed on a whole main surface of the semiconductor device shown in FIG. 27.

FIG. 29 is a cross section showing a state in which the Ti layer 9 is formed on the whole main surface of the p-type silicon substrate 1 shown in FIG. 27. In FIG. 29, it can be seen that there is a disconnection in the Ti layer 9 on a portion of the first insulating film 13 in which the local interconnection is not to be formed. This is due to the fact that, in FIG. 27, the second insulating film 14 was intentionally removed, and thereby a level of the surface of the first insulating film 13 abruptly changes in a region in which the local interconnection is not to be formed.

In other words, the conditions which deteriorate the step coverage is intentionally employed when forming the Ti layer 9 in FIG. 29. Since the first insulating film 13a covering the lower portion of the gate electrode 4b is left in the local interconnection forming region, change in level of the surface can be more moderate than the other portion.

The Ti layer 9 is formed by the sputtering method with poor step coverage. Thereby, on the first insulating film 13, the Ti layer 9 is disconnected as shown in FIG. 29. In this case, even if the silicide layer grows in the portion in which the local interconnection is not to be formed, the silicide layer portions on the first insulating film 13 can be prevented effectively from being joined together as compared with the embodiments described before. As a result, a manufacturing margin for formation of the silicide layer 7 can be improved.

Fourth Embodiment

Figure 30:
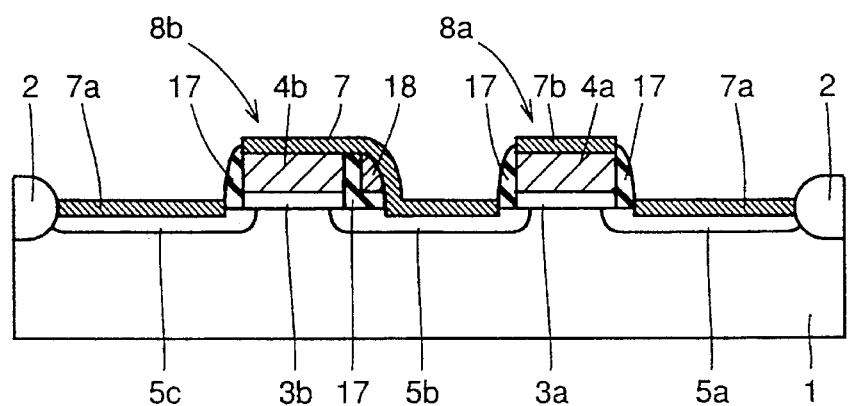
FIG. 30 is a cross section showing a semiconductor device of a fourth embodiment of the invention.

Referring to FIGS. 30 to 36, a fourth embodiment of the invention will be described below. FIG. 30 is a cross section showing a semiconductor device of the fourth embodiment of the invention. In this embodiment shown in FIG. 30, side wall insulating film 17 covering the whole side walls of the gate electrode 4b is formed also under the position in which the local interconnection is formed. A polysilicon layer 18 is formed on the surface portion of the side wall insulating film 17 under the local interconnection forming region.

The silicide layer 7 is formed of silicide portions at the surfaces of the gate electrode 4b, polysilicon layer 18 and n-type impurity region 5c which are integrally joined together. In this embodiment, a problem of separation of the local interconnection (titanium silicide layer) can be prevented owing to the silicide layer 7 thus structured, similarly to the first embodiment. Since the side wall insulating film 17 and the polysilicon layer 18 are formed between the gate insulating film 3b and the titanium silicide layer 7, deterioration of the breakdown voltage of the gate insulating film 3b can be suppressed more effectively than the second and third embodiments. The polysilicon layer 18 may be an amorphous silicon layer or a conductive layer containing silicon.

Referring to FIGS. 31 to 36, a method of manufacturing the semiconductor device of this embodiment will be described below. FIGS. 31 to 36 are cross sections showing 1st to 6th steps in a process for manufacturing the semiconductor device of the embodiment.

Figure 31:
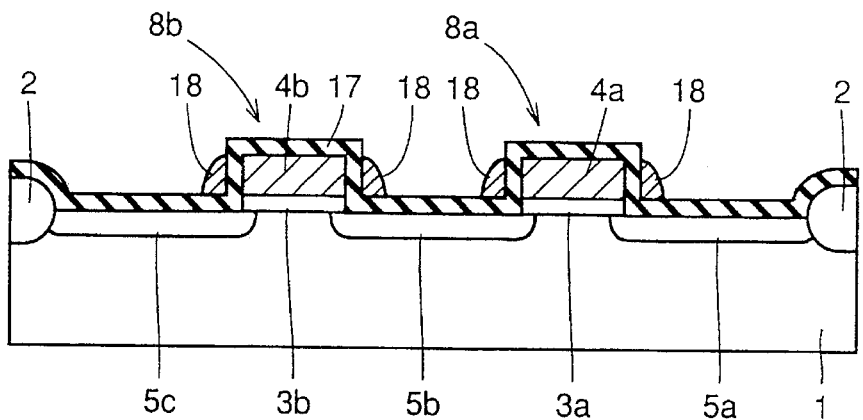
FIGS. 31–36 are cross sections showing 1st to 6th steps in a method of manufacturing the semiconductor device of the fourth embodiment of the invention, respectively.

Referring first to FIG. 31, steps from the start to formation of the n-type impurity regions 5a, 5b and 5c are executed similarly to the first embodiment. The CVD method or the like is used to deposit the first insulating film 17 of about 1000Å in thickness. The polysilicon layer 18 of about 1000Å to about 1500Å in thickness is deposited on the first insulating film 17 by the CVD method, sputtering method or the like. Anisotropic etching is effected on the polysilicon layer 18 to leave the polysilicon layer 18 on the side walls of the gate electrodes 4a and 4b.

Figure 32:
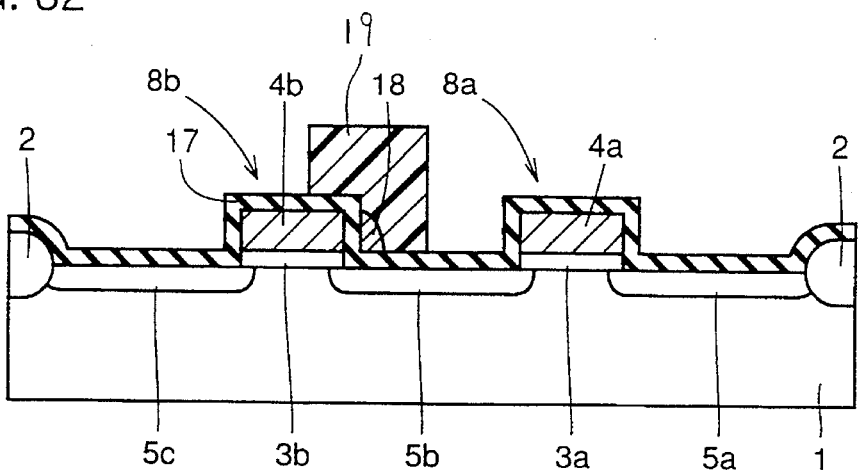

Referring to FIG. 32, a resist pattern 19 covering only the local interconnection forming region is formed. Using the resist pattern 19 as a mask, the polysilicon layer 18 located in a region other than the local interconnection forming region is removed. Thereafter, the resist pattern 19 is removed. Then, anisotropic etching is effected on the first insulating films 17 to form the side wall insulating film 17 and to expose the top surfaces of the gate electrodes 4a and 4b as well as the surfaces of the n-type impurity regions 5a, 5b and 5c.

Figure 34:
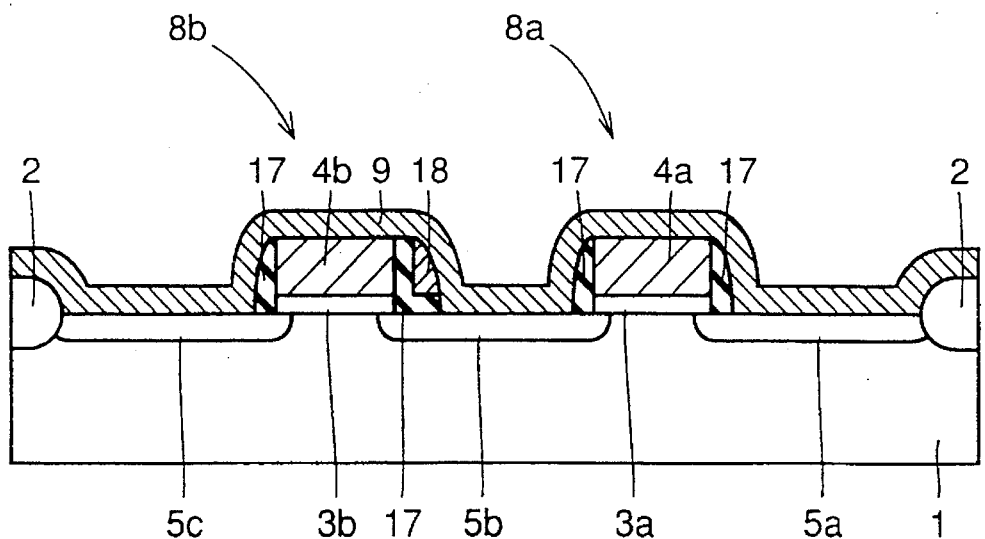

Referring to FIG. 34, the Ti layer 9 is deposited on the whole main surface of the p-type silicon substrate by the sputtering method or the like. Then, heat treatment is effected. Only one heat treatment under the conditions of about 600° C. to 700° C. and 30 seconds is sufficient. Thereby, the titanium silicide layer 7 is formed as shown in FIG. 36, after the state shown in FIG. 35.

In this embodiment, the polysilicon layer 18 is formed on the surface of the side wall insulating film 17. Thus, a source from which silicon is supplied in the silicidation is newly formed on the side wall insulating film 17. Therefore, the local interconnection (titanium silicide layer 7) can be formed even if a heat treatment temperature for the silicidation is lower than that in the embodiments described before.

Figure 35:
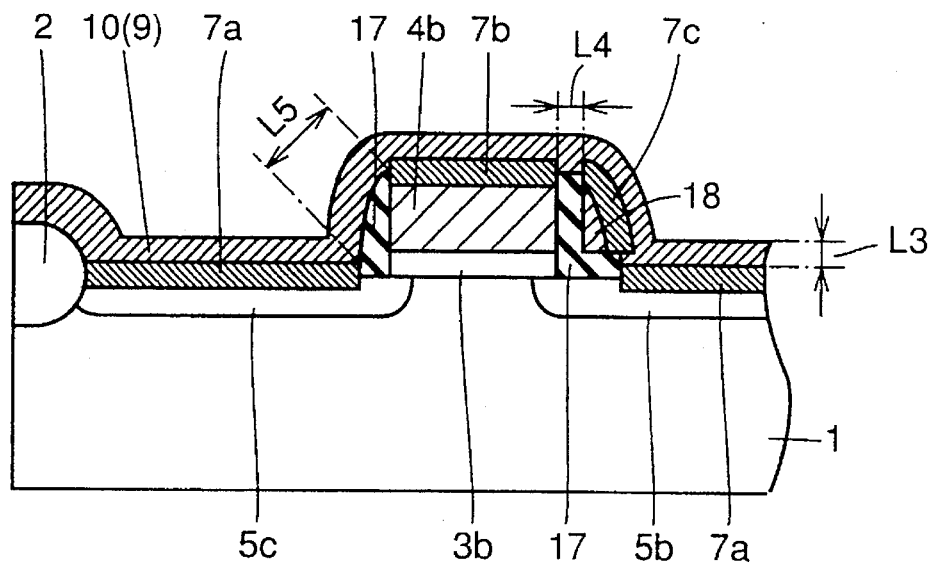
Figure 36:
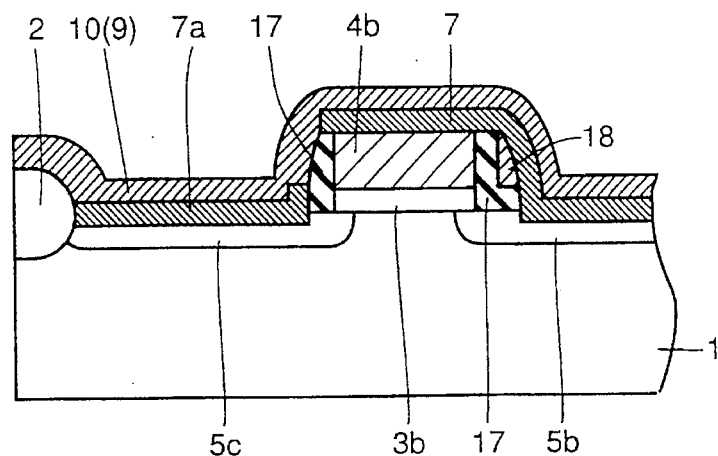

In FIG. 35, there are shown distances relating to the local interconnection forming region, i.e., a distance L4 between the silicide portion 7b at the top surface of the gate electrode 4 and the silicide portion 7c at the surface of the polysilicon layer 18, as well as a distance L3 between the silicide portion 7c and the silicide portion 7a at the surface of the n-type impurity region 5c. Each of the distances L4 and L3 is shorter than a length L5 between the silicide portions 7b and 7a in the region other than the local interconnection forming region.

Thereby, the silicide portions 7b, 7a and 7c can be integrally joined together only in the region in which the local interconnection is to be formed. According to the manufacturing method of this embodiment, the side wall insulating film 17 functions as a stopper to leave the polysilicon layer 18, so that etching damage to the base can be prevented.

Fifth Embodiment

A fifth embodiment of the invention will be described below with reference to FIGS. 37 and 38, which are cross sections showing distinctive steps in a method of manufacturing the semiconductor device of the fifth embodiment of the invention.

Figure 33:
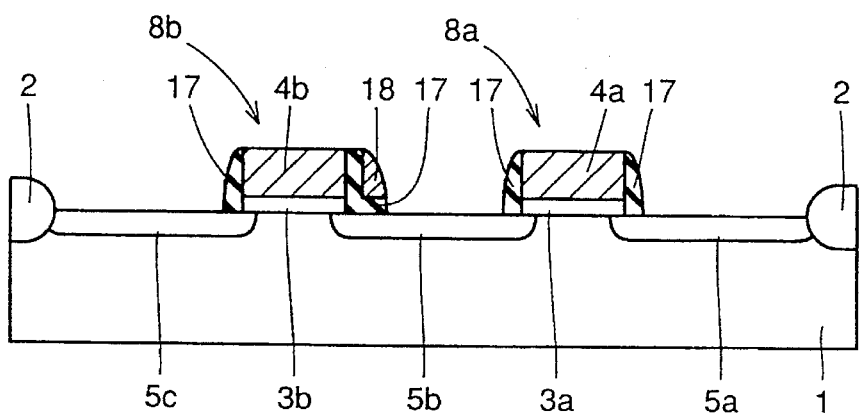
Figure 37:
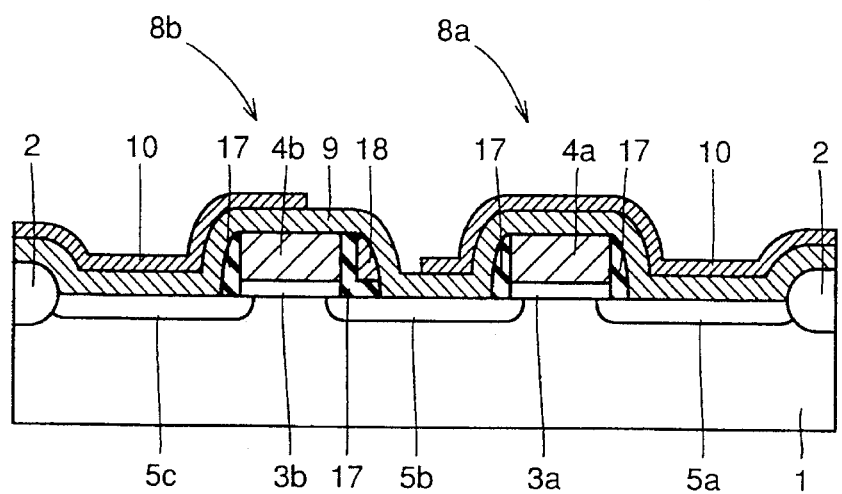
FIG. 37 is a cross section showing a distinctive step of manufacturing a semiconductor device of a fifth embodiment of the invention.

Referring first to FIG. 37, structures similar to those shown in FIG. 33 are obtained through steps similar to those of the fourth embodiment. Then, the Ti layer 9 is deposited on the whole main surface of the p-type silicon substrate 1, e.g., by the sputtering method. Heat treatment is effected on the Ti layer 9 in nitrogen atmosphere to nitride the surface thereof and thereby the TiN layer 10 is formed at the surface thereof. The TiN layer 10 may be deposited in an independent step, e.g., by the sputtering method after forming the Ti layer 9.

The TiN layer 10 is patterned to expose the surface portion of the Ti layer 9 located in the local interconnection forming region. Then, heat treatment is executed similarly to the first embodiment. The TiN layer 10 functions to suppress growth of the silicide layer as described before. Therefore, growth of the titanium silicide layer under the TiN layer 10 can be suppressed. Accordingly, the titanium silicide layer can grow to a relatively large extent in the portion from which the TiN layer 10 was removed, so that the local interconnection shown in FIG. 30 can be formed.

After formation of the local interconnection in this manner, wet etching is effected to remove the TiN layer 10 and not-yet-reacted Ti layer 9. Thereby, the semiconductor device having structures similar to those shown in FIG. 30 can be obtained.

Figure 38:
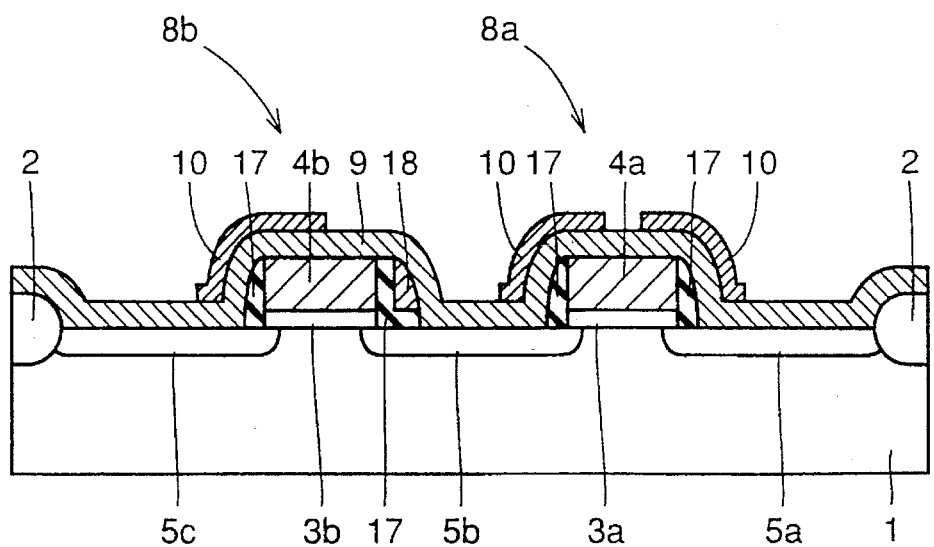
FIG. 38 is a cross section showing a modification of the manufacturing step shown in FIG. 37.

Although the TiN layer 10 in FIG. 37 is formed to cover the entire surface of the Ti layer 9 except in the local interconnection forming region, it may be left only in regions in which the local interconnection is not to be formed, as shown in FIG. 38. The embodiments in FIGS. 37 and 38 have been described in connection with the case where the polysilicon layer 18 is formed, this embodiment can be applied to the other cases.

Sixth Embodiment

Figure 39:
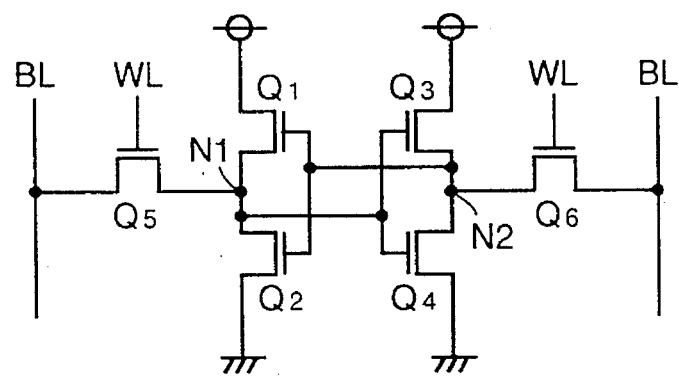
FIG. 39 is an equivalent circuit diagram showing an SRAM of a sixth embodiment of the invention.

Referring to FIGS. 39 to 42, a sixth embodiment of the invention will be described below. This embodiment relates to an SRAM to which the invention is applied. FIG. 39 is an equivalent circuit diagram showing one memory cell in the SRAM. Referring to FIG. 39, one memory cell includes six transistors Q1, Q2, Q3, Q4, Q5 and Q6. One pair of the driver transistors Q2 and Q4 (n-type MOS transistors) and one pair of the load transistors Q1 and Q3 (p-type MOS transistors) are mutually connected to form a flip-flop circuit.

Source regions of the paired load transistors Q1 and Q3 are connected to the power supply Vcc. Source regions of the paired driver transistors Q2 and Q4 are connected to the ground. A pair of the access transistors Q5 and Q6 (n-type MOS transistors) are connected to storage nodes N1 and N2, respectively. A bit line BL is connected to one of source/drain regions of each of the access transistors Q5 and Q6. Gate electrodes of the access transistors Q5 and Q6 are connected to word lines WL.

Figure 40:
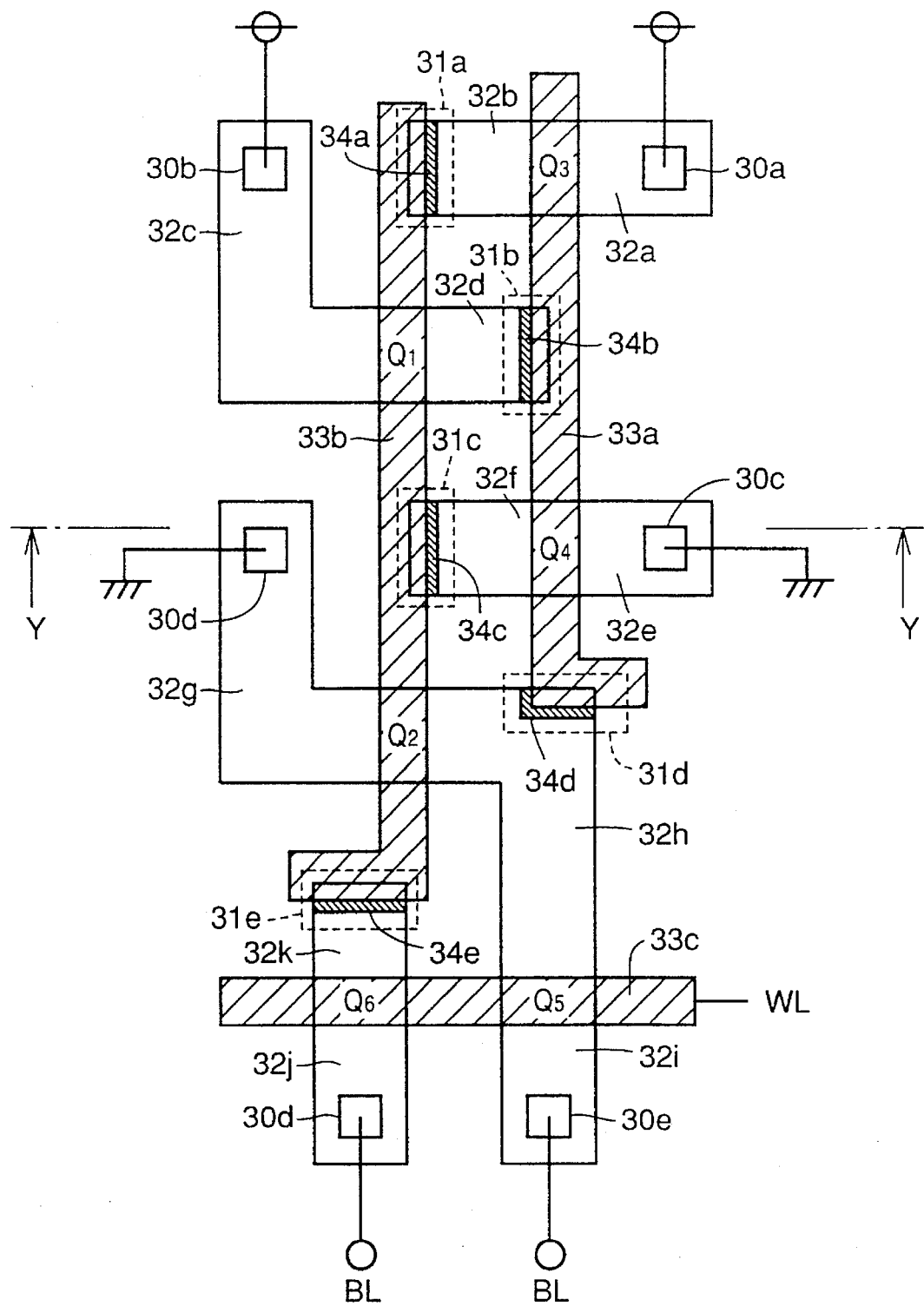
FIG. 40 is a plan of the SRAM shown in FIG. 39.

FIG. 40 is a plan of the SRAM shown in FIG. 39. Referring to FIG. 40, the load transistor Q3 and driver transistor Q4 have a common gate electrode 33a made of polysilicon or the like. The load transistor Q1 and driver transistor Q2 have a common gate electrode 33b made of polysilicon or the like. The access transistors Q5 and Q6 have a common gate electrode 33c made of polysilicon or the like.

The load transistor Q3 has p-type impurity regions 32a and 32b, and is connected to the power supply Vcc through a contact 30a. The load transistor Q1 has p-type impurity regions 32c and 32d, and is connected to the power supply Vcc through a contact 30b. The driver transistor Q4 has n-type impurity regions 32e and 32f, and is grounded through a contact 30c. The driver transistor Q2 has n-type impurity regions 32g and 32h, and is grounded through a contact 30d. The access transistor Q5 has n-type impurity regions 32h and 32i, and is connected to the bit line BL through a contact 30e. The access transistor Q6 has n-type impurity regions 32j and 32k, and is connected to the bit line BL through a contact 30f.

In the SRAM thus structured, local interconnections 34a, 34b, 34c, 34d and 34e each made of a titanium silicide layer is formed in regions 31a, 31b, 31c, 31d and 31e.

Figure 41:
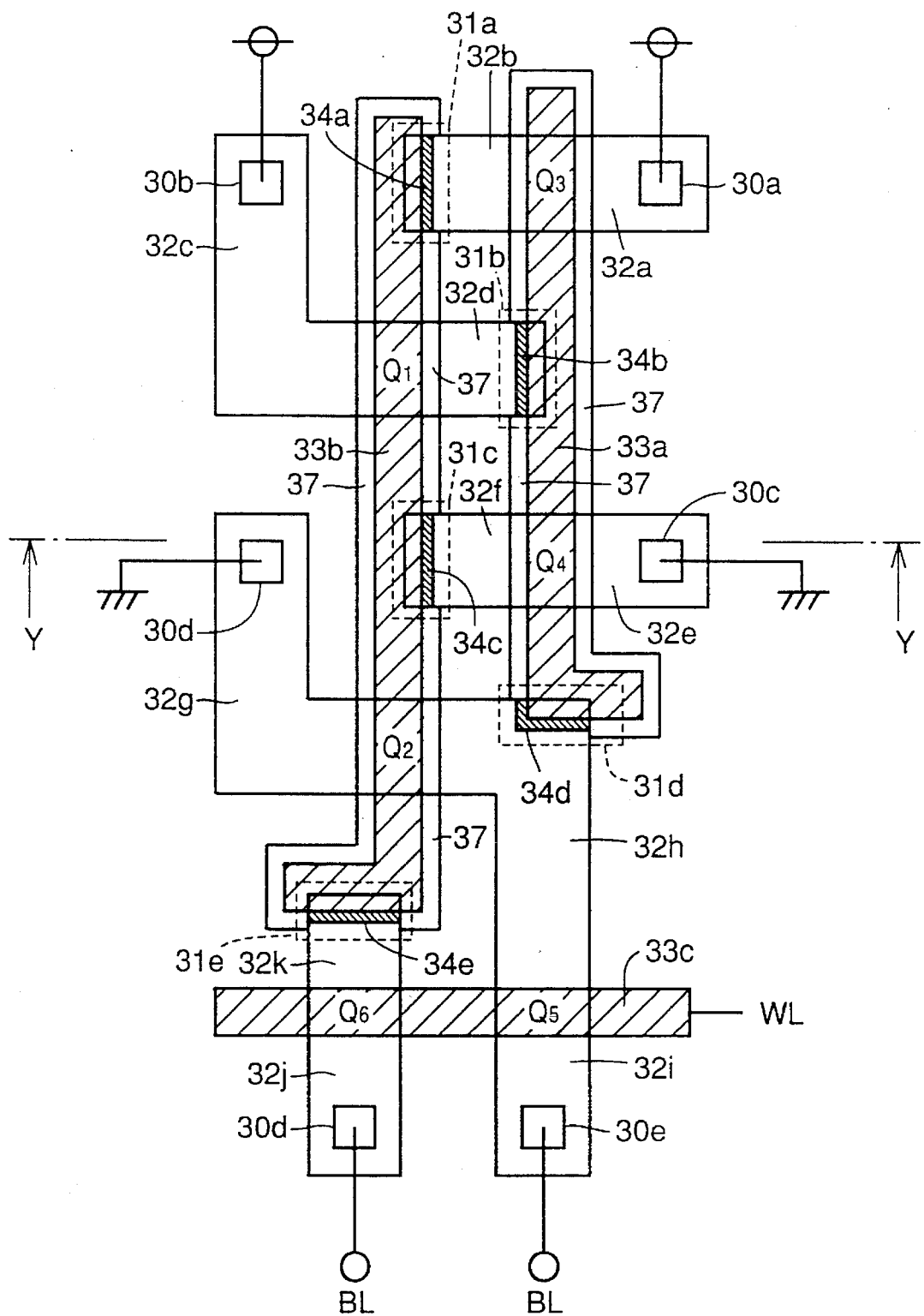
FIG. 41 is a plan showing planar layout of side wall insulating films in the SRAM shown in FIG. 40.

Referring to FIG. 41, configurations of side wall insulating films 37 formed on the side walls of the gate electrodes 33a–33c will be described below. FIG. 41 is a plan showing configurations of the side wall insulating films 37 formed on the side walls of the gate electrodes 33a–33c.

Referring to FIG. 41, the side wall insulating films 37 are formed on the side walls of the gate electrodes 33a, 33b and 33c. The side wall insulating films 37 have thinned portions located in regions in which the local interconnections 34a, 34b, 34c, 34d and 34e are formed. Owing to this, the local interconnections 34a–34e which electrically connect the intended gate electrodes to the intended impurity regions can be formed based on a principle similar to that of the embodiments described before.

Figure 42:
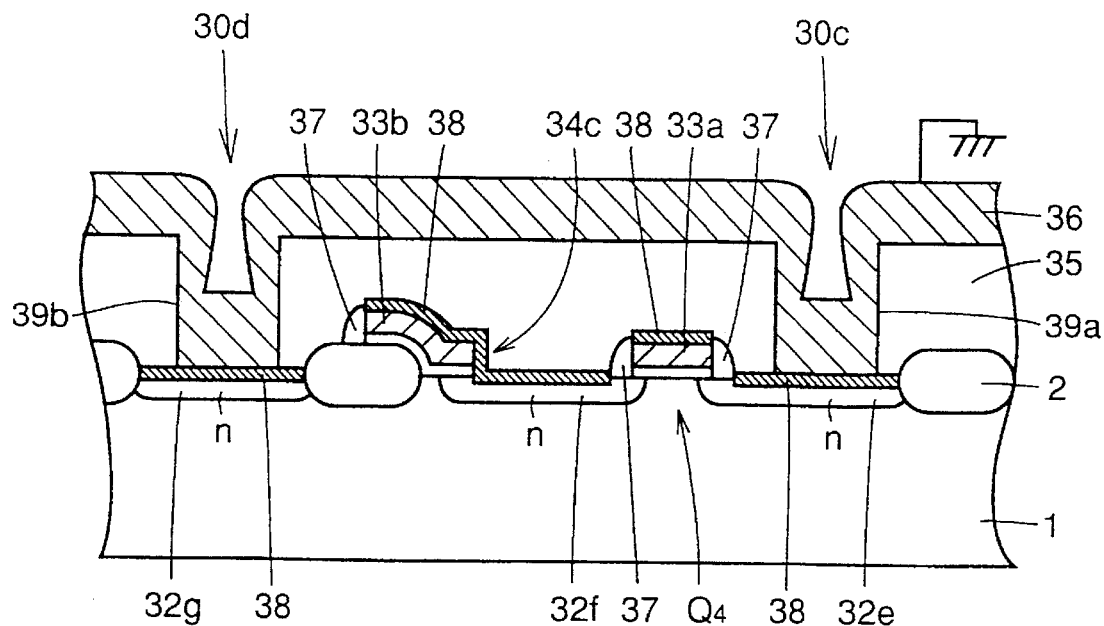
FIG. 42 is a cross section taken along line Y—Y in FIG. 40.

Referring to FIG. 42, sectional structure of the SRAM shown in FIG. 40 will be described below. FIG. 42 is a cross section taken along line Y—Y in FIG. 40. Referring to FIG. 42, the element isolating and insulating films 2 are formed in the main surface of the p-type silicon substrate 1 with spaces between each other. The driver transistor Q4 is formed at a region in the main surface of the p-type silicon substrate 1 which is surrounded by the element isolating and insulating films 2.

The gate electrode 33b of the load transistor Q1 extends over one of the element isolating and insulating films 2. The gate electrode 33b thus extended is connected to one (32f) of the impurity regions of the driver transistor Q4 through the local interconnection 34c. In this structure, the side wall insulating film 37 is removed from a region on the gate electrode 33b placed aside the n-type impurity region 32f, and the local interconnection 34c is formed in this region. Thereby, the gate electrode 33b and the n-type impurity region 32f can be electrically connected together.

The n-type impurity region 32g formed in the main surface of the p-type silicon substrate 1 is located so that the element isolating and insulating film 2 positioned under the gate electrode 33b is located between the n-type impurity regions 32f and 32g. Titanium silicide layers 38 are formed on the surfaces of the n-type impurity regions 32g, 32f and 32e and gate electrodes 33a and 33b.

The p-type silicon substrate 1 is provided at the main surface with an interlayer insulating film 35. The interlayer insulating film 35 is provided with contact holes 39a and 39b located on the n-type impurity regions 32e and 32g, respectively. An aluminum interconnection layer 36 is formed on inner surfaces of the contact holes 39a and 39b and on the interlayer insulating film 35. The aluminum interconnection layer 36 is in contact with the n-type impurity region 32g through the contact 30d and is in contact with the n-type impurity region 32c through the contact 30c.

As described before, since the gate electrode and the impurity region adjacent thereto are connected together by the local interconnection, it is not necessary to form a contact hole, an interlayer insulating film and others for making the connection, so that the patterns can be integrated to a high degree. Since the local interconnection according to the invention has a large adhesive strength with respect to the base, there is substantially no possibility of separation, resulting in high reliability of the semiconductor device.

Seventh Embodiment

Figure 43:
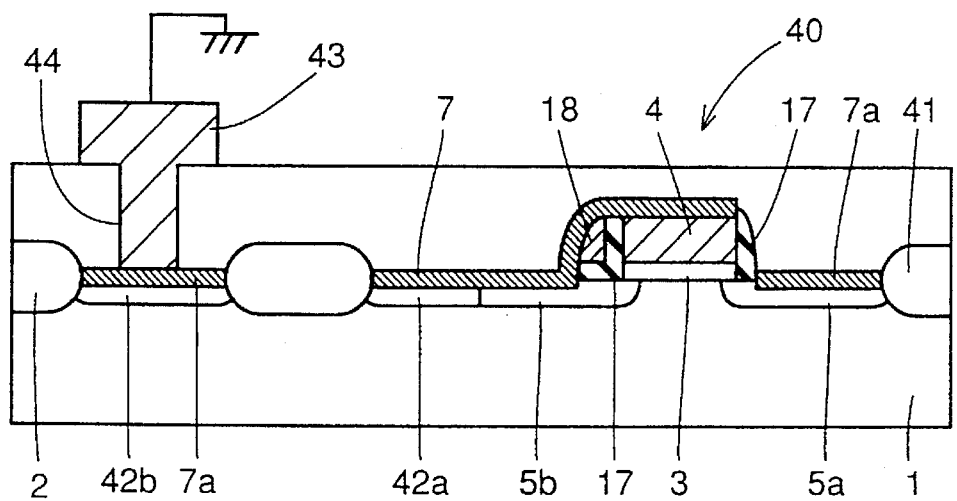
FIG. 43 is a cross section showing a semiconductor device of a seventh embodiment of the invention.
Figure 44:
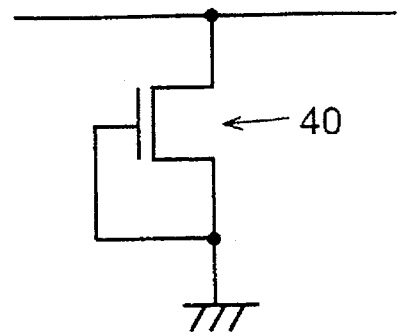
FIG. 44 is an equivalent circuit diagram of the semiconductor device shown in FIG. 43.
Figure 45:
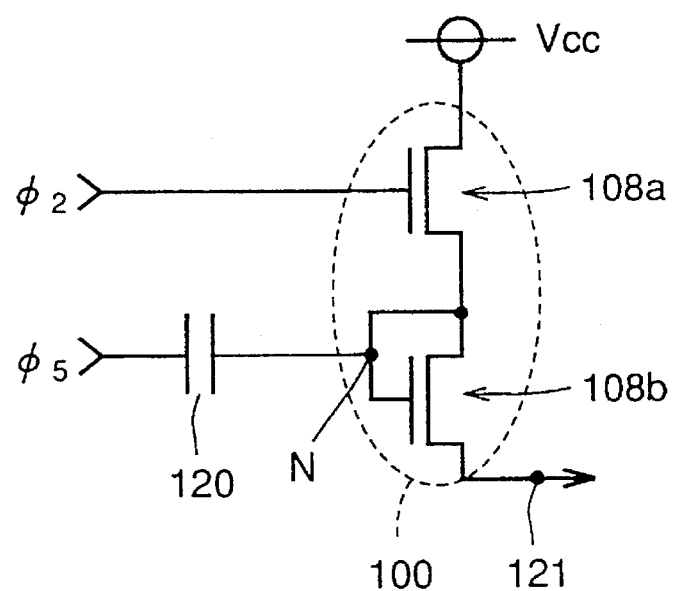
FIG. 45 is an equivalent circuit diagram showing an example of a semiconductor device including a conventional local interconnection.

Referring to FIGS. 43 to 44, a seventh embodiment of the invention will be described below. FIG. 43 is a cross section of the semiconductor device of the seventh embodiment of the invention. FIG. 44 is an equivalent circuit diagram of the semiconductor device shown in FIG. 43.

Referring to FIGS. 43 and 44, the p-type silicon substrate 1 is provided at its main surface with the element isolating and insulating films 2 which are spaced from each other. A MOS transistor 40 is formed at a region in the main surface of the p-type silicon substrate 1 located between the element isolating and insulating films 2. The MOS transistor 40 has the n-type impurity regions 5a and 5b, gate insulating film 3 and gate electrode 4.

The side walls 17 are formed on the side walls of the gate electrode 4. The polysilicon layer 18 is formed on the surface of the side wall insulating film 17 over which the local interconnection is to be formed. A p-type impurity region 42a is formed adjacent to the n-type impurity region 5b.

Based on the same principle as that in the fourth embodiment, the titanium silicide layer 7 is formed over the region extending from the top surface of the gate electrode 4 to the surfaces of the n-type and p-type impurity regions 5b and 42a. The titanium silicide layer 7 forms the local interconnection.

The p-type silicon substrate 1 is also provided at its main surface with a p-type impurity region 42b which is positioned so that the element isolating and insulating film 2 is located between the p-type impurity regions 42a and 42b. The titanium silicide layer 7a is also formed in the surface of the p-type impurity region 42b. An insulating film 41 is formed on the main surface of the p-type silicon substrate 1. The insulating film 41 is provided with a contact hole 44 located on the p-type impurity region 42b. An interconnection layer 43, which is grounded, is formed in the contact hole 44.

Owing to the above structures, the gate electrode 4 is electrically connected to the p-type impurity region 42a through the local interconnection 7. The p-type impurity region 42a is of the same conductivity type as the p-type silicon substrate 1 and thus is electrically connected thereto. The p-type impurity region 42b is also electrically connected to the p-type silicon substrate 1.

Thereby, the interconnection layer 43 and the gate electrode 4 can be electrically connected together. As a result, the gate electrode 4 is grounded. Since the gate electrode can be grounded without using an upper interconnection as described before, high integration of the pattern can be achieved easily. In this embodiment, the supply voltage can be applied to the gate electrode 4 if the MOS transistor 40 is formed of a p-channel transistor.

In the embodiments described above, the invention is applied to the n-type MOS transistors. The invention, however, can be applied to p-type MOS transistors, CMOS circuits and bipolar transistors. In each embodiment already described, the Ti layer is used. Alternatively, a layer of refractory metal such as Co, Ni, Pt, Pb, Ta, Mo, W or Cr may be used. Although a single polysilicon layer is used as the gate electrode, the gate electrode may have a polycide structure made of polysilicon and refractory metal silicide such as WSi, MoSi or TiSi.

According to the semiconductor device of an aspect of the invention, the side wall insulating film located on the first side wall portion is removed. Thereby, the silicide layer extending from the surface region of the interconnection layer to the surface region of the impurity region can be formed. This silicide layer forms the local interconnection. Therefore, a problem such as separation of the local interconnection can be prevented because the local interconnection is not formed of a new layer of material different from that of the silicide layer, which is contrary to the prior art. Since the local interconnection is formed in a self-aligned manner, high integration of the patterns can be easily achieved. Since the local interconnection itself is formed of the silicide layer, electrical resistance thereof can be reduced.

According to the semiconductor device of another aspect of the invention, the silicide layer grows on the first surface portion covering the insulating film. Therefore, a stress applied to the insulating film is reduced and thus breakdown voltage of the insulating film can be suppressed. As a result, reliability of the semiconductor device can be improved.

According to the semiconductor device of still another aspect of the invention, the conductive layer made of material containing silicon is formed at the predetermined portion in the surface of the side wall insulating film. The silicide layer is formed of the surface portions of the interconnection layer, conductive layer and impurity regions which are integrally joined together. Owing to the fact that the conductive layer made of material containing silicon is newly provided as described above, the silicide layer can be formed easily. Also in this case, a problem such as separation of the local interconnection can be overcome. A region in which the silicide layer grows can be made far apart from the insulating film compared with the semiconductor device of the above aspect. Thereby, influence on the insulating film by growth of the silicide layer can be further reduced compared with the case of the above aspect.

According to the method of manufacturing the semiconductor device of the invention, the silicide layer can be formed by integrally connecting the silicide portions in the surface layers of the interconnection layer and impurity region. Since the silicide layer forms the local interconnection, a problem such as separation of the local interconnection, which may be caused in the prior art, can be completely prevented. Therefore, a portion of the refractory metal, which has not been turned into silicide, can be removed by wet etching. Accordingly, the local interconnection can be formed more easily than the prior art.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a silicon substrate of a first conductivity type having a main surface;
   an interconnection layer made of material containing silicon and formed on a first region in said main surface of said silicon substrate with an insulating film interposed therebetween;
   a first impurity region of a second conductivity type formed at a second region, which is adjacent to said first region, in said main surface of said silicon substrate;
   a first side wall insulating film formed on a portion of a side wall of said interconnection layer except for a first side wall portion positioned at an upper end portion of said side wall of said interconnection layer placed aside said first impurity region; and
   a silicide layer formed extending from a top surface of said interconnection layer to a surface of said first impurity region via a position on said first side wall portion, said silicide layer further comprising:
      first, second and third silicide portions formed on said in top surface of said interconnection layer, a surface of each of said first side wall portion not covered with said first side wall insulating film and said first side wall insulating film, said second silicide portion in direct contact with said first side wall insulating film, and said surface of said first impurity region, respectively, said first, second and third silicide portions being joined together.

2. The semiconductor device according to claim 1, wherein:
   said first side wall insulating film covering at least a side end portion of said insulating film which is located under said first side wall portion.

3. The semiconductor device according to claim 1, wherein:
   a second impurity region of the second conductivity type, is located at an opposite side of the first region relative to the first impurity region, and is formed in said main surface of said silicon substrate,
   wherein said silicide layer, said interconnection layer and said first impurity region cooperate to serve as one electrode of an MOS diode, and said second impurity region serves as another electrode of said MOS diode.

4. The semiconductor device according to claim 1, wherein said semiconductor device is an SRAM (Static Random Access Memory).

5. A semiconductor device, comprising:
   a silicon substrate of a first conductivity type having a main surface;
   an interconnection layer made of material containing silicon and formed on a first region in said main surface of said silicon substrate with an insulating film interposed therebetween;
   a first impurity region of a second conductivity type formed at a second region, which is adjacent to said first region, in said main surface of said silicon substrate;
   first and second side wall insulating films covering opposite side walls of said interconnection layer;
   a conductive layer made of material containing silicon formed on said first side wall insulating film placed aside said first impurity region, said conductive layer not being formed on said second side wall insulating film; and
   a silicide layer formed extending from a top surface of said interconnection layer via a surface of said conductive layer to a surface of said first impurity region, said silicide layer further comprising:
      first, second and third silicide portions formed on said top surface of said interconnection layer, said surface of said conductive layer and said surface of said first impurity region, respectively, said first, second and third silicide portions being joined together.

6. The semiconductor device according to claim 5, wherein:
   a second impurity region of the second conductivity type is formed in said main surface of said silicon substrate, and located at an opposite side of said first region relative to said first impurity region,
   wherein said silicide layer, said interconnection layer and said first impurity region cooperate to serve as one electrode of an MOS diode, and said second impurity region serves as another electrode of said MOS diode.

7. A semiconductor device, comprising:
   a silicon substrate of a first conductivity type having a main surface;
   an interconnection layer made of material containing silicon and formed on a first region in said main surface of said silicon substrate with an insulating film interposed therebetween;
   a first impurity region of a second conductivity type formed at a second region, which is adjacent to said first region, in said main surface of said silicon substrate;
   first and second side wall insulating films covering opposite side walls of said interconnection layer;
   a conductive layer made of material containing silicon formed on said first side wall insulating film placed aside said first impurity region, said conductive layer not being formed for said second side wall insulating film; and
   a silicide layer formed extending from a top surface of said interconnection layer via a surface of said conductive layer to a surface of said first impurity region, said silicide layer further comprising:
      first, second and third silicide portions formed on said top surface of said interconnection layer, said surface of said conductive layer and said surface of said first impurity region, respectively, said first, second and third silicide portions being joined together, wherein said silicon substrate is provided at its main surface with a second impurity region of the second conductivity type being located at an opposite side of said first region relative to said first impurity regione;
   said semiconductor device further includes
   a third impurity region of the first conductivity type formed being in contact with said first impurity region in said main surface of said silicon substrate, and
   a fourth impurity region of the first conductivity type spaced from said third impurity region and formed in the main surface of said silicon substrate; and said silicide layer extending on a surface of said third impurity region and electrically connecting said interconnection layer, said silicon substrate and said fourth impurity region.

8. A semiconductor device, comprising:

a silicon substrate of a first conductivity type having a main surface in which first and second transistors are formed;

first and second impurity regions of a second conductivity type formed in said main surface of said silicon substrate and defining a channel region of said first transistor;

a first gate electrode of said first transistor formed on said channel region with a first insulating film interposed therebetween;

first and second side wall insulating films covering opposite side walls of said first gate electrode;

a second gate electrode of said second transistor formed on a first region at an opposite side of said channel region relative to the first impurity region with a second insulating film interposed between said first region and said second gate electrode;

a third side wall insulating film formed on a side wall of said second gate electrode and covering a portion of said side wall of said second gate electrode except for a first side wall portion placed aside said first impurity region; and a silicide layer formed extending from a top surface of said second gate electrode via a position on said first side wall portion to a surface of said first impurity region, said silicide layer further comprising, first, second and third silicide portions formed on said top surface of said second gate electrode, a surface of each of said first side wall portion and said third side wall insulating film, said second silicide portion in direct contact with said third side wall insulating film, and said surface of said first impurity region, respectively, said first, second and third silicide portions being joined together.

* * * * *